United States Patent
Drowley et al.

(10) Patent No.: US 11,637,209 B2
(45) Date of Patent: Apr. 25, 2023

(54) JFET WITH IMPLANT ISOLATION

(71) Applicant: NEXGEN POWER SYSTEMS, INC., Santa Clara, CA (US)

(72) Inventors: Clifford Drowley, Santa Clara, CA (US); Andrew P. Edwards, Santa Clara, CA (US); Subhash Srinivas Pidaparthi, Santa Clara, CA (US); Ray Milano, Santa Clara, CA (US)

(73) Assignee: NEXGEN POWER SYSTEMS, INC., Santa Clara, CA (US)

( * ) Notice: Subject to any disclaimer, the term of this patent is extended or adjusted under 35 U.S.C. 154(b) by 175 days.

(21) Appl. No.: 17/131,568

(22) Filed: Dec. 22, 2020

(65) Prior Publication Data
US 2021/0193846 A1    Jun. 24, 2021

Related U.S. Application Data

(60) Provisional application No. 62/953,059, filed on Dec. 23, 2019.

(51) Int. Cl.
| | |
|---|---|
| *H01L 29/808* | (2006.01) |
| *H01L 29/66* | (2006.01) |
| *H01L 27/06* | (2006.01) |
| *H01L 29/20* | (2006.01) |
| *H01L 29/78* | (2006.01) |
| *H01L 29/06* | (2006.01) |
| *H01L 27/088* | (2006.01) |

(52) U.S. Cl.
CPC ...... *H01L 29/8083* (2013.01); *H01L 27/0676* (2013.01); *H01L 27/0886* (2013.01); *H01L 29/0642* (2013.01); *H01L 29/2003* (2013.01); *H01L 29/66909* (2013.01); *H01L 29/785* (2013.01)

(58) Field of Classification Search
CPC ............ H01L 29/8083; H01L 27/0886; H01L 29/785; H01L 29/66924; H01L 27/0629; H01L 29/732; H01L 27/0676; H01L 29/861; H01L 29/6609
See application file for complete search history.

(56) References Cited

U.S. PATENT DOCUMENTS

| | | | | |
|---|---|---|---|---|
| 2013/0112985 A1* | 5/2013 | Kizilyalli | .......... | H01L 29/66909 257/E29.089 |
| 2017/0287904 A1* | 10/2017 | Balakrishnan | ........ | H01L 29/045 |

* cited by examiner

*Primary Examiner* — Wasiul Haider
(74) *Attorney, Agent, or Firm* — Kilpatrick Townsend & Stockton LLP

(57) ABSTRACT

A vertical junction field effect transistor (JFET) includes a substrate, an active region having a plurality of semiconductor fins, a source metal layer on an upper surface of the fins, a source metal pad layer coupled to the semiconductor fins through the source metal layer, a gate region surrounding the semiconductor fins, and a body diode surrounding the gate region.

16 Claims, 22 Drawing Sheets

JFET WITH IMPLANT ISOLATION

CROSS-REFERENCES TO RELATED APPLICATIONS

This application claims priority to U.S. Provisional Patent Application No. 62/953,059, filed on Dec. 23, 2019, entitled "Method and System for JFET with Implant Isolation," the disclosure of which is hereby incorporated by reference in its entirety for all purposes.

BACKGROUND OF THE INVENTION

Power electronics are widely used in a variety of applications. For example, power electronic devices are commonly used in power switching applications. Typical devices that are currently used for power applications are metal-oxide-semiconductor field effect transistors (MOSFET) and insulated gate bipolar transistors (IGBT).

SUMMARY OF THE INVENTION

Embodiments of the present invention provide novel vertical JFET devices with a monolithically integrated source to drain connected body diode. Monolithic integration, rather than using a co-packaged diode, can reduce the parasitic inductance and resistance of the interconnects between the transistor and the diode terminals and reduce part count, thus package cost, complexity and board space.

Numerous benefits are achieved by the present invention over conventional techniques. Embodiments of the present invention provide methods and apparatuses that provide a vertical JFET including an integrated source to drain connected body diode, which is desirable for a variety of circuit applications. In the conventional configuration, the JFET equivalent circuit contains a pair of diodes connected from gate to source and gate to drain. The gate connected diodes have the possibility of being turned on under certain conditions and drawing current from the gate. A gate driver circuit would need to be able to handle this current, which is not desirable. In a common circuit topology, a diode connected from source-to-drain can be used as a freewheeling or flyback diode to prevent build-up of high voltage across the transistor switch in an inductive circuit. An advantage of using GaN for the body diode is the lack of minority carrier storage, enabling fast switching and low power loss. In another embodiment, the diode is fabricated as a Schottky diode for low turn-on voltage and high switching speed. In another embodiment, the diode is fabricated as a merged P-i-N Schottky (MPS) diode. The MPS structure is capable of a combination of low turn-on voltage and low reverse bias leakage.

According to an embodiment of the present invention, a vertical junction field effect transistor (JFET) includes a substrate, an active region having a plurality of semiconductor fins, a source metal layer on an upper surface of the fins, a source metal pad layer coupled to the semiconductor fins through the source metal layer, a gate region surrounding the semiconductor fins, and a body diode surrounding the gate region.

According to an embodiment of the present invention, a method of manufacturing a vertical junction field effect transistor (JFET) includes providing a semiconductor substrate of a first conductivity type and having a first surface and a second surface, forming a plurality of fins coupled to the semiconductor substrate, forming a gate layer of a second conductivity type opposite the first conductivity type surrounding the plurality of fins, and forming an isolation region surrounding the plurality of fins, while concurrently forming a body diode region surrounding the isolation region.

According to an embodiment of the present invention, a vertical junction field effect transistor (JFET) is provided. The vertical JFET includes a substrate, an active region comprising a plurality of semiconductor fins, and a source metal layer electrically coupled to a surface of the semiconductor fins. The vertical JFET also includes a source metal pad layer coupled to the semiconductor fins through the source metal layer, a gate region surrounding the semiconductor fins, and a body diode surrounding the gate region.

According to another embodiment of the present invention, a method of manufacturing a vertical junction field effect transistor (JFET) is provided. The method includes providing a semiconductor substrate of a first conductivity type and having a first surface and a second surface and forming a plurality of fins coupled to the semiconductor substrate. The method also includes forming a gate layer of a second conductivity type opposite the first conductivity type surrounding the plurality of fins and concurrently: forming an isolation region surrounding the plurality of fins and forming a body diode region surrounding the isolation region.

According to a specific embodiment of the present invention, a semiconductor device is provided. The semiconductor device includes a substrate comprising an n+ GaN layer, a drift layer coupled to the substrate and comprising an n− GaN layer, and a plurality of fins comprising an n GaN material and coupled to the drift layer. The semiconductor device also includes a gate layer comprising a p GaN material and surrounding the plurality of fins, an integrated diode body surrounding the plurality of fins, and an isolation region disposed between the plurality of fins and the integrated diode body.

Additional features and advantages will be apparent to those skilled in the art upon reading the following detailed description and the accompanying drawings.

BRIEF DESCRIPTION OF THE DRAWINGS

The accompanying drawings form a part of the present disclosure that describes exemplary embodiments of the present invention. The drawings together with the specification will explain the principles of the invention.

DETAILED DESCRIPTION OF THE INVENTION

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

As discussed above, conventional depletion-inversion MOSFETs have a source to drain connected body diode inherent in their structure. This body diode is utilized in a variety of switching circuit topologies. A junction field effect transistor (JFET) does not have this source-to-drain-connected body diode inherent in the structure. Insulated-gate bipolar transistors (IGBTs) are typically co-packaged with a discrete diode that provides a similar functionality. Therefore, there is a need to monolithically integrate a body diode with a vertical JFET device.

Figure 1:
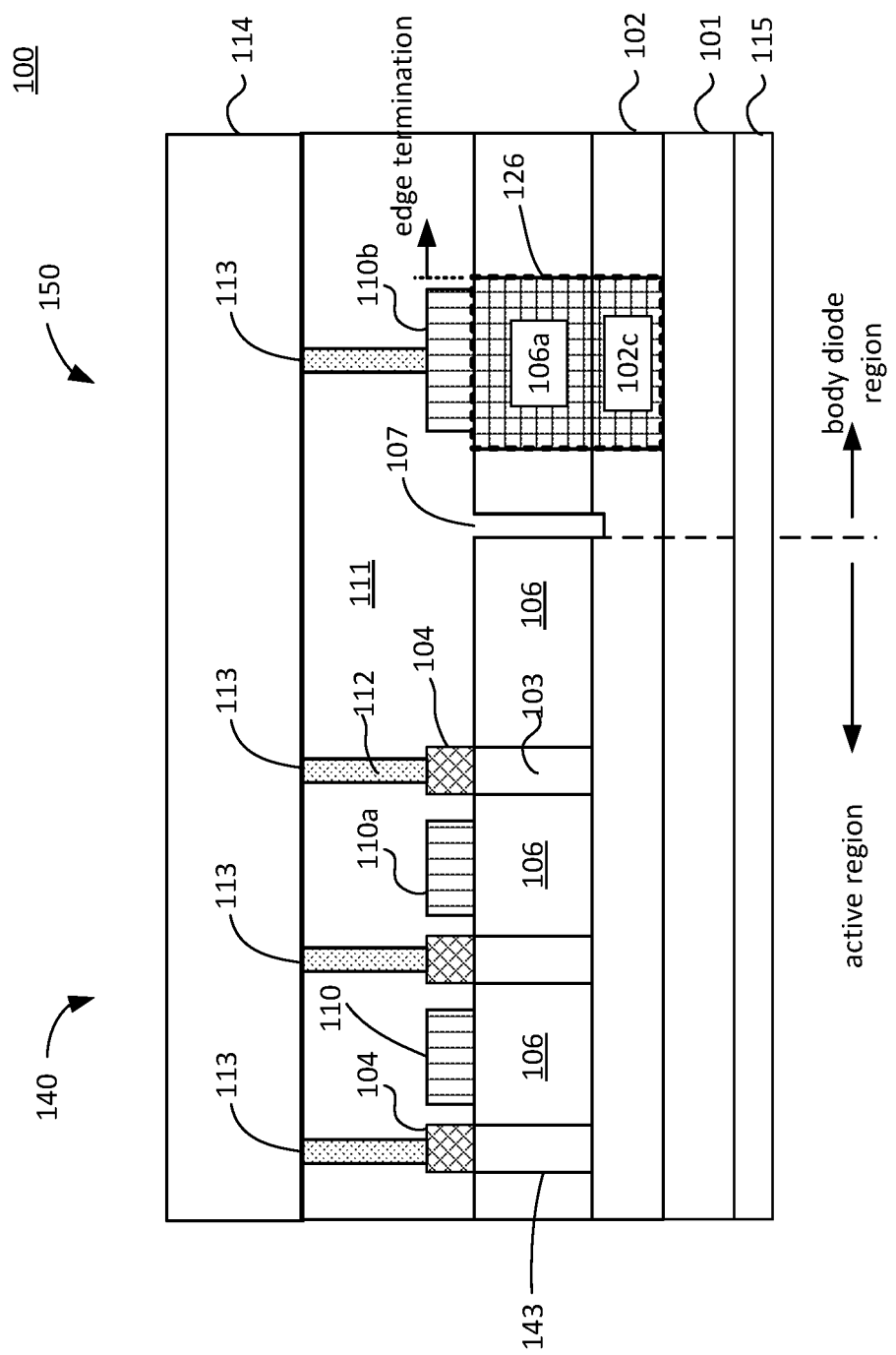
FIG. 1 is a cross-sectional view of a vertical fin-based field effect transistor (FinFET) device with an integrated body diode according to an embodiment of the present disclosure.

FIG. 1 illustrates a partial cross-sectional view of a vertical fin-based field effect transistor (FinFET) device 100 with an integrated body diode according to an embodiment of the present disclosure. The FinFET structure (i.e., the active region) is shown in a region 140, and the body diode (i.e., the body diode region) is shown in a region 150. The body diode anode and the source terminals are connected through vias to the pad metal disposed above the FinFET device. An isolation region provides electrical isolation of the FinFET active region from the body diode, by disconnecting the conducting p-GaN layer between them. In one embodiment, the isolation region is formed using an ion implantation step (e.g., using nitrogen or argon) to form traps that neutralize the p-GaN layer. In another embodiment, the isolation region is formed by using ion implantation of n-type donor atoms to counter-dope the p-GaN layer. In another embodiment, the isolation region is formed using a plasma treatment (e.g., in a hydrogen plasma), which deactivates the dopant atoms in the p-GaN layer. In another embodiment, the isolation region is a trench filled with a dielectric material. The FinFET and diode share the same drift layer. In one embodiment, the integrated body diode is a PN diode. In other embodiments, the integrated body diode is an MPS diode.

Referring to FIG. 1, FinFET device 100 may include a semiconductor substrate 101, a drift layer 102 on semiconductor substrate 101, and a plurality of fins 103 on drift layer 102. In one embodiment, semiconductor substrate 101 is an n+ doped substrate, drift layer 102 is an n-doped layer, and fins 103 are formed in an n doped layer 143. The notation "n+", "n−" and "n" indicate the relative doping relationships among semiconductor substrate 101, drift layer 102, and fins 103. Generally, semiconductor substrate 101 is more heavily doped than fins 103, which, in turn, are more heavily doped than drift layer 102. Actual doping concentrations vary depending on the technology and application of the FinFET device 100. FinFET device 100 may further include a source metal layer 104 on an upper surface of fins 103. In one embodiment, source metal layer 104 may be a refractory metal, a refractory metal compound, or a refractory metal alloy (e.g., TiN).

FinFET device 100 may further include a gate layer 106 on drift layer 102, with gate layer 106 surrounding fins 103. In one embodiment, gate layer 106 may be doped to form a p-type doped layer. In one embodiment, the p-type doping may be performed using ion implantation of acceptor species, followed by an activation process. In one embodiment, the p-type doping may be performed by regrowing an epitaxial p-type doped GaN layer using metallorganic chemical vapor deposition (MOCVD) or molecular beam epitaxy (MBE). In one embodiment, the gate layer has an upper surface flush with the upper surface of the fins. In one embodiment, the gate layer is non-planar, and substantially conformal to the side surface of the fins and the top of the drift layer 102. FinFET device 100 may also include an isolation region 107 in gate layer 106 and surrounding gate layer 106 and fins 103. In one embodiment, isolation region 107 may extend into drift layer 102. In one embodiment, isolation region 107 may terminate at the interface between gate layer 106 and drift layer 102.

FinFET device 100 may further include a body diode 126 (a box indicated by a dotted line) that surrounds isolation region 107. Diode body includes a portion 106a of the p-type doped layer, which forms an anode of the diode body, and a portion 102c of drift layer 102 below the portion 106a of the p-type doped layer, which forms a cathode of the body diode.

FinFET device 100 may further include a gate metal layer 110 that includes a portion 110a on gate layer 106 and a portion 110b on the anode 106a of diode body 126. FinFET device 100 may further include an interlayer dielectric layer 111 overlying gate layer 106, gate metal layer 110 (110a, 110b), and isolation region 107. FinFET device 100 may also include through-holes (or via holes) 112 that extend through interlayer dielectric layer 111 and expose an upper surface of source metal layer 104 and an upper surface of the portion 110b of gate metal layer 110 associated with body diode 126. Hereinafter, the portion 110a of gate metal layer 110 is denoted as fin gate metal layer 110a, and the portion 110b of gate metal layer 110 is denoted anode metal layer 110b. In one embodiment, the through-holes are filled with a metal material to form vias 113. In one embodiment, isolation region 107 may include a trench formed in the gate layer and extending to the interface between the gate layer and the drift layer. In one embodiment, the trench of isolation region 107 may include a dielectric material, such as silicon dioxide or silicon nitride. In one embodiment, isolation region 107 may be formed in an n-type doped region. In one embodiment, isolation region 107 may include a fin (not shown) that is floating, i.e., the source of the fin is not electrically connected to any potential.

FinFET device 100 may further include a source pad metal layer 114 on interlayer dielectric layer 111 and in electrical contact with source metal layer 104 on the upper surface of fins 103 through vias 113 and the portion 110b of gate metal layer 108 associated with the body diode through vias 113. FinFET device 100 may further include a drain metal layer 115 on the bottom surface of semiconductor substrate 101. Body diode 126 is connected between source pad metal layer 114 and drain metal layer 115.

In some embodiments, semiconductor substrate 101 may include an n+ doped III-nitride material, fins 103 may include an n doped III-nitride material, drift layer 102 may include an n− doped nitride material. In one embodiment, the n+ doped III-nitride material has a dopant concentration of about $1 \times 10^{19}$ atoms/cm$^3$, the n doped III-nitride material has a dopant concentration of about $7.5 \times 10^{16}$ atoms/cm$^3$, and the n− doped III-nitride material has a dopant concentration of about $1 \times 10^{16}$ atoms/cm$^3$.

In one embodiment, semiconductor substrate 101 includes an n+ GaN material layer, first semiconductor layer 102 includes an n− GaN drift layer, and gate layer 106 includes a p-type GaN layer. Fins 103 are formed in an n GaN layer. Anode 106a is formed in a p-type GaN layer having a dopant concentration substantially the same as the dopant concentration of gate layer 106. Cathode 102c includes a dopant concentration substantially the same as the dopant concentration of drift layer 102.

Figures 2A, 2B:
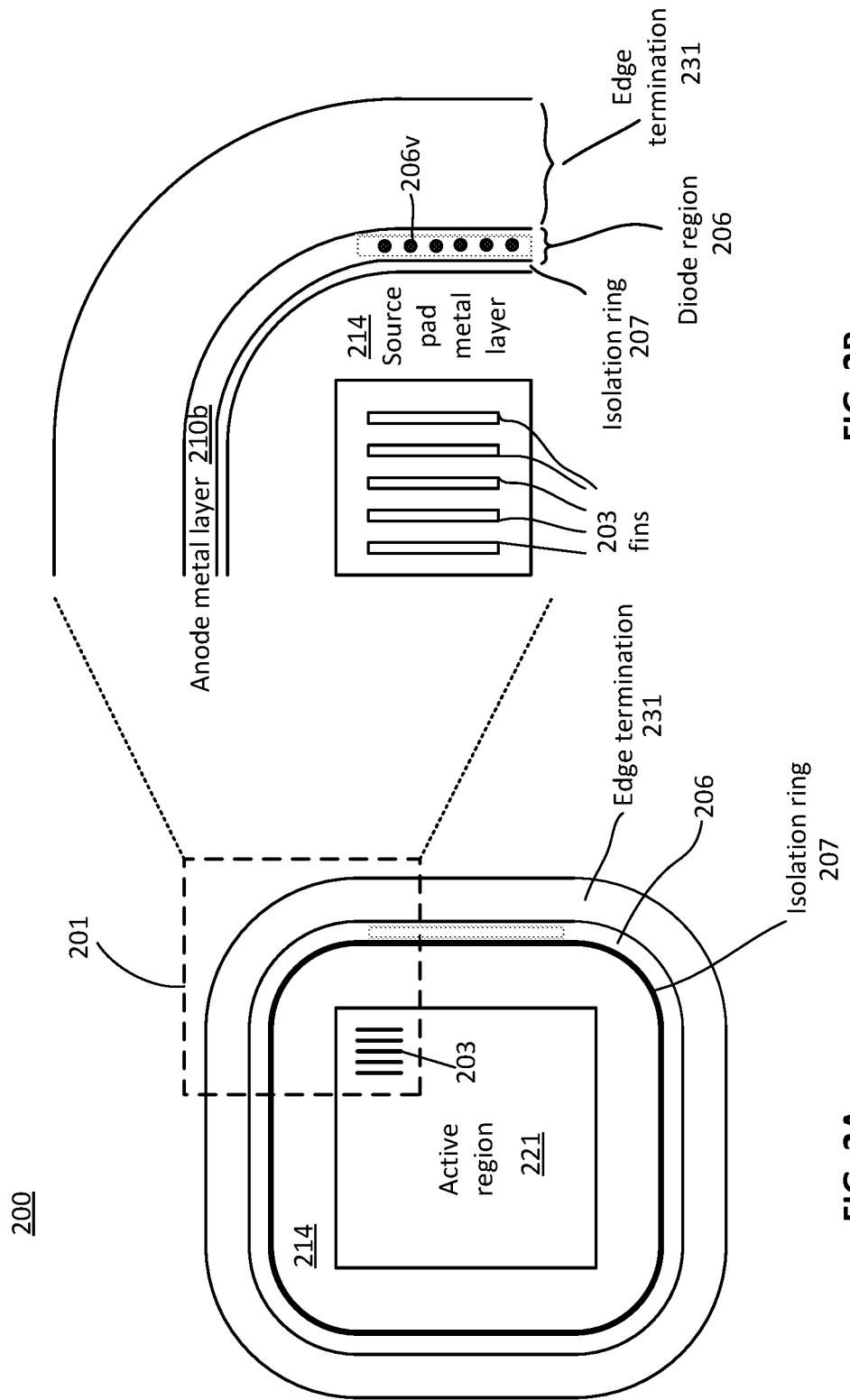
FIG. 2A is a simplified plan view of a vertical fin-based field effect transistor (FinFET) device with an integrated body diode according to an embodiment of the present disclosure.
FIG. 2B is an enlarged view of a portion of the exemplary layout of the vertical FinFET device shown in FIG. 2A.

FIG. 2A is a simplified plan view illustrating an exemplified layout of a vertical fin field effect transistor (FinFET) device 200 with an integrated body diode according to an embodiment of the present disclosure. In some embodiments, the body diode is formed at the perimeter of the FinFET active region, inside the edge termination. The body diode is electrically separated from the FinFET active region by an isolation region, which is compatible with the FET process. In the case of a standard PN-body diode, the FinFET gate metal is used to form an ohmic contact to the p-type GaN anode of the diode or a merged PN-Schottky diode with additional process steps. The anode is connected by vias through a dielectric layer to the source pad metal layer above.

Referring to FIG. 2A, FinFET device 200 includes an active region 221 having a plurality of semiconductor fins 203 arranged in parallel along a first (e.g., vertical) direction, a source pad metal layer 214 that is formed overlying the semiconductor fins. A large number of vias (e.g., vias 113 shown in FIG. 1) are formed on an upper surface of the semiconductor fins and in electrical contact with the source pad metal layer 214 to decrease a source resistance. A diode region 206 is formed surrounding active region 221 and includes a large number of vias 206v (illustrated in FIG. 2B) that are electrically connected to the source pad metal layer 214 to decrease the contact resistance of anode metal layer 110b of the body diode. FinFET device 200 further includes an isolation ring 207 disposed between the active region 221 and the diode region 206. FinFET device 200 further includes an edge termination region 231 adjacent and surrounding diode region 206.

FIG. 2B is an enlarged view of a portion 201 of the exemplary layout of FinFET device 200 shown in FIG. 2A. Referring to FIG. 2B, a portion of active region 221 is shown as having a plurality of elongated semiconductor fins 203 in electrical contact with source pad metal layer 214, isolation ring 207 is formed below source pad metal layer 214, an anode metal layer 210b disposed in the diode region 206 and in electrical contact with anode 106a of body diode 126, and a plurality of vias 206v electrically connecting anode metal layer 210b to source pad metal layer 214. A cross-sectional view of the portion the exemplary layout of FinFET device 200 is shown in FIG. 1.

Figure 3:
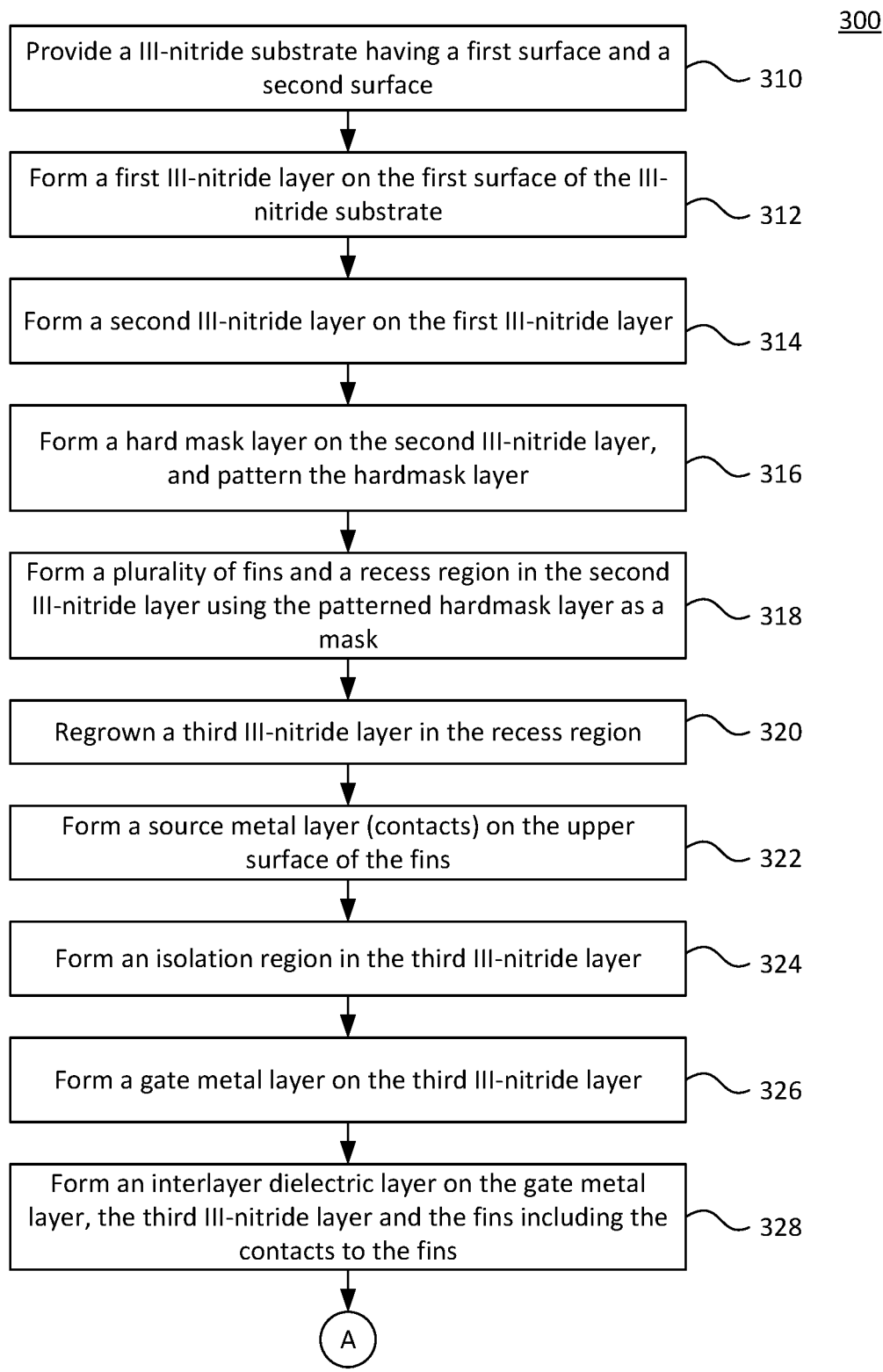
FIG. 3 is a simplified flowchart of a method of manufacturing a vertical FinFET device with an integrated body diode according to an embodiment of the present disclosure.
Figure 3:
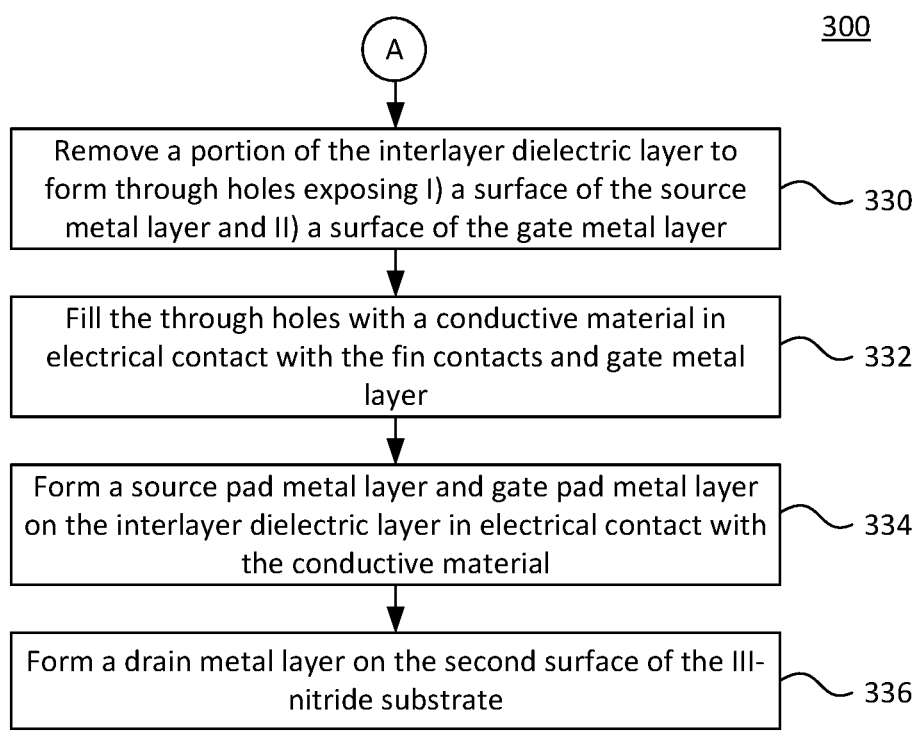

FIG. 3 is a simplified flowchart illustrating a method 300 for manufacturing a vertical fin-based FET (FinFET) device with an integrated body diode connected between a source and a drain of the vertical FinFET device according to an embodiment of the present disclosure. Referring to FIG. 3, method 300 may include providing a III-nitride substrate (310) having a first surface and a second surface opposite the first surface. In an embodiment, the III-nitride substrate is an n+ GaN substrate. A first III-nitride layer is epitaxially grown on the first surface of the III-nitride substrate, for example, at a temperature between 950 degrees Celsius and 1100 degrees Celsius, and is characterized by a first dopant concentration, e.g., n-type doping with a dopant concentration of about $1 \times 10^{16}$ atoms/cm$^3$ (312). In some embodiments, the first III-nitride layer is a drift layer. Method 300 further includes forming a second III-nitride epitaxial layer on the first III-nitride layer (314). In an embodiment, the second III-nitride layer is characterized by a second dopant concentration that is higher than the dopant concentration of the first III-nitride layer. In an embodiment, the second dopant concentration is about $1 \times 10^{17}$ atoms/cm$^3$. In an embodiment, a region with a graded dopant concentration is formed between the first III-nitride layer and a constant-dopant-concentration region in the second III-nitride layer. In some embodiments, the second III-nitride epitaxial layer is a fin layer. Method 300 further includes forming a patterned hard mask layer on the second III-nitride layer (316). In one embodiment, the patterned hard mask layer is formed by depositing and patterning a dielectric material. In one embodiment, the patterned hard mask layer consists of a source metal layer on the second III-nitride layer, and a patterned hard mask layer formed on the source metal layer, which is used as a mask to etch the source metal layer thereby creating a composite patterned hard mask layer. Method 300 further includes forming a plurality of semiconductor fins that are separated by a recess region in the second III-nitride layer using the patterned hard mask layer as a mask (318).

Method 300 further includes regrowing a third III-nitride epitaxial layer in the recess region (320). In an embodiment, the regrown III-nitride layer is a gate layer and is characterized by a conductivity type that is opposite the conductivity type of the first and second III-nitride layers. Method 300 further includes forming a source metal layer as contacts on the upper surface of the n-type fin (322). In an embodiment, the contacts are self-aligned. In an embodiment, the source metal layer of the hard mask makes electrical contact to the top of the n-type fins. Method 300 further includes forming an isolation region in the third III-nitride epitaxial layer (324). In an embodiment, the isolation region may be formed by carrying out an etch process (e.g., a reactive ion etching process) to form an isolation trench. In one embodiment, the isolation trench may be filled with an insulating material, such as a dielectric (silicon dioxide, silicon nitride). Referring to FIG. 1, the isolation trench may be the isolation region 107 that surrounds the fins 103. In another embodiment, method 300 may include selectively implanting an n-type dopant into the isolation trench to form a vertical isolation implant layer in the third III-nitride layer. In another embodiment, method 300 may include selectively implanting nitrogen, argon or helium to form traps that neutralize the p-GaN doping, and form an implanted isolation trench. In another embodiment, method 300 may include selectively treating the third III-nitride epitaxial layer with a plasma (e.g., a hydrogen plasma) to locally deactivate the dopant in the third III-nitride epitaxial layer. In yet another embodiment, the isolation region may include a fin that is floating, i.e., the floating fin is not connected to the source pad metal layer that will be formed in subsequent process steps.

Method 300 further includes forming a gate metal layer on the third III-nitride epitaxial layer (326). Referring to FIG. 1, the gate metal layer has a first portion 110*a* disposed on a first portion of the third III-nitride layer that is on one side of the isolation region 107 and surrounds the semiconductor fins and a second portion 110*b* disposed on a second portion of the third III-nitride layer that is on the opposite side of the isolation region and does not have semiconductor fins. Method 300 further includes forming an interlayer dielectric layer (e.g., interlayer dielectric layer 111) covering the source metal layer, the gate metal layer, and the third III-nitride epitaxial layer (328). Method 300 further includes masking and etching the interlayer dielectric layer to form through-holes exposing an upper surface of the source metal layer on the second III-nitride layer and an upper surface of the second portion of the gate metal layer disposed on the opposite side of the isolation region. Thus, method 300 includes etching the interlayer dielectric layer using a patterned hard mask layer as a mask to form through-holes exposing the source metal layer (source metal layer 104 on fins 103) and the gate metal layer (330) and filling the through holes with a conductive material to form a plurality of vias, which are in contact with the source metal layer and the gate metal layer (332).

Method 300 further includes forming a source pad metal layer on the interlayer dielectric layer, which is in electrical contact with the conductive material in contact with the source metal layer, and a gate pad metal layer on the interlayer dielectric, which is in electrical contact with the conductive material in contact with the gate metal layer (334), and forming a drain metal layer on the second surface of the III-nitride substrate (336).

It should be understood that the specific steps illustrated in FIG. 3 provide a particular method of fabricating a vertical FinFET device with an integrated body diode according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual steps. Furthermore, additional steps may be added or removed depending on a particular application. One of ordinary skill in the art would recognize may variations, modifications, and alternatives.

Figure 4A:
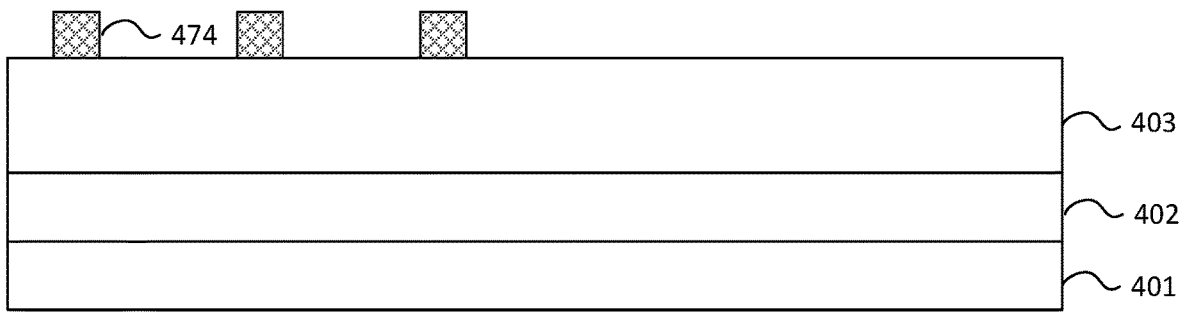
FIGS. 4A through 4L are cross-sectional views illustrating intermediate stages of a method of manufacturing a vertical FinFET device with an integrated body diode according to an embodiment of the present disclosure.

Referring back to FIG. 3 and with reference to FIGS. 4A through 4I, a method of manufacturing a vertical FinFET device is described according to some embodiments of the present invention. FIG. 4A is a partial cross-sectional view illustrating an n+ doped semiconductor substrate 401, an n− doped semiconductor layer 402 epitaxially grown on the n+ doped semiconductor substrate 401, and an n doped semiconductor layer 403 epitaxially grown on the n− doped semiconductor layer 402. In one embodiment, the n− doped semiconductor layer 402 forms the drift region of the device, and is doped with n-type dopants such as silicon. In one embodiment, a patterned hard mask (474) is formed on the n-doped semiconductor layer 403. In one embodiment, a metal layer (not shown) is formed on the n doped semiconductor layer 403, a hard mask layer (not shown) is formed and patterned on the metal layer, and an etch process is performed on the metal layer using the patterned hard mask layer as a mask to obtain a patterned hard mask and source metal layer 404. In one embodiment, the patterned hard mask layer may include silicon dioxide or silicon nitride. In one embodiment, the patterned hard mask layer may be formed by PECVD. In another embodiment, the patterned hard mask layer may be formed using RIE with F-based chemistry. In one embodiment, the n+ doped semiconductor substrate may be an n+ doped III-nitride substrate with n-type dopants in the range of about $5 \times 10^{17}$ atoms/cm$^3$ to about $1 \times 10^{19}$ atoms/cm$^3$. In one embodiment, the drift region may have a net n-type dopant concentration in the range of about $1 \times 10^{16}$ to $1 \times 10^{17}$ atoms/cm$^3$. In one embodiment, the n doped semiconductor layer 403 may have a dopant concentration in the range of about $1 \times 10^{17}$ to $1 \times 10^{18}$ atoms/cm$^3$. In one embodiment, the metal layer may include TiN. These steps correspond to steps 310 to 316 of the method 300 shown in FIG. 3.

Figure 4B:
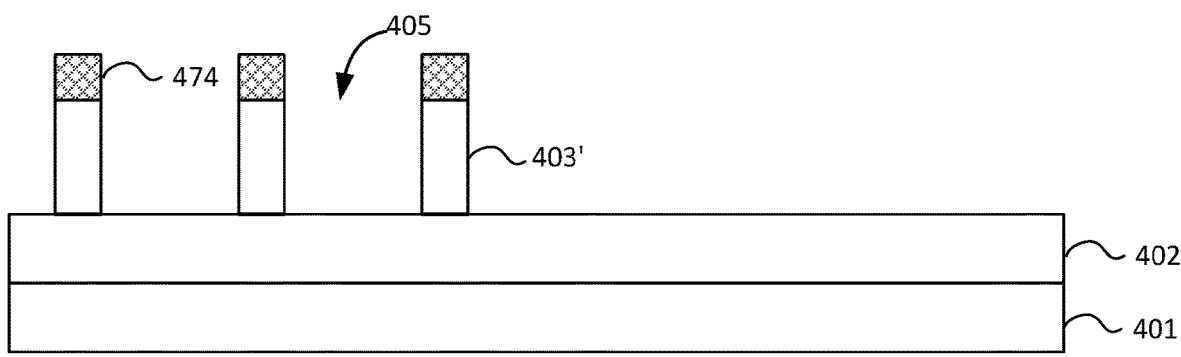

FIG. 4B is a partial cross-sectional view illustrating the device structure after the etch process has been performed to obtain a plurality of semiconductor fins 403' that are separated by a recess region 405 (step 318). It is noted that the bottom of the trench between the fins may have a shape different from the shape shown in FIG. 4B after the etch process. Embodiments of the present invention are described herein with reference to cross-section illustrations that are schematic illustrations of idealized embodiments and intermediate structures of the invention. The thickness of layers and regions in the drawings may not be drawn to scale for purposes of clarity. Variations from the shapes of the illustrations as a result, for example, of manufacturing techniques and/or tolerances, are expected. Thus, embodiments of the invention should not be construed as limited to particular shapes of regions illustrated herein, but are to include deviations in shapes that result from manufacturing.

In the following drawings, the bottom portion of the fins are shown as having a 90 degrees angle with the surface of the drift region, i.e., the fins are shown as having a cross-sectional rectangular shape. It is understood that the bottom portion of the fins may have rounded or curved features. Thus, the regions illustrated in the figures are schematic in nature and their shapes are not intended to illustrate the actual shape of a region of the device and are not intended to limit the scope of the invention. In one embodiment, the depth of the recess region 405 may be different in different regions of the device. In one embodiment, the depth of the recess region 405 may be larger in the region where the body diode is subsequently formed (see e.g., FIG. 4D).

In one embodiment, after forming recess region 405, a cleaning process and/or a pre-cleaning processes are carried out using a TMAH solution.

Figure 4C:
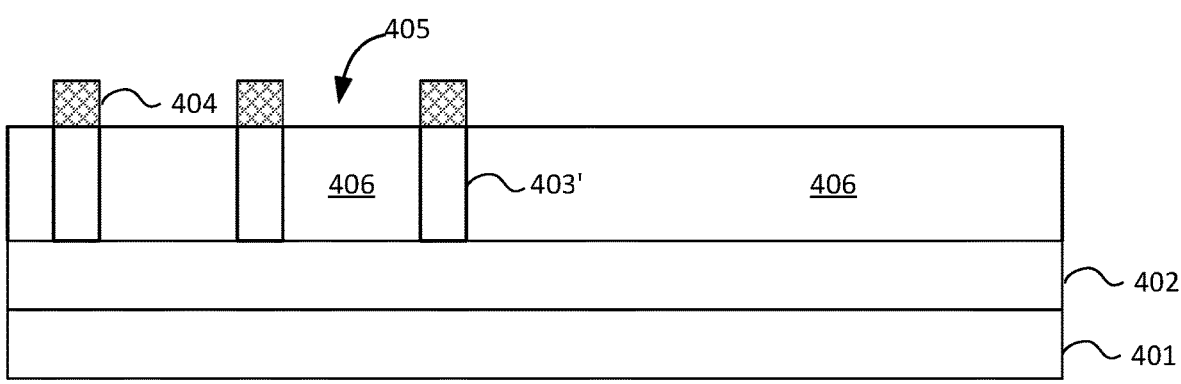

FIG. 4C is a partial cross-sectional view illustrating the device structure after the third semiconductor layer 406 has been epitaxially regrown in the recess region (step 320). In one embodiment, third semiconductor layer 406 may include a p-type III-nitride layer that is epitaxially and uniformly grown in the recess region up to a thickness that is substantially planar to the bottom of source metal layer 404. In one embodiment, the p-type III-nitride layer may be doped with Mg with a dopant concentration of about $1\times10^{19}$ atoms/cm$^3$. In one embodiment, an annealing process may be carried out to activate the Mg dopant atoms in an amount of greater than 10 percent by weight. In one embodiment, the patterned hard mask layer 474 is removed, exposing the upper surface of the fins, and a source metal layer 404 is formed on the upper surface of the fins (step 322). In one embodiment, a patterned source mask layer (not shown) having openings is formed overlying the exposed upper surface of the fins, and the source metal layer is formed on the upper surface of the fins through the openings of the patterned source mask layer and serves as source contacts for the fins. Thereafter, the patterned source mask layer is removed.

Figure 4D:
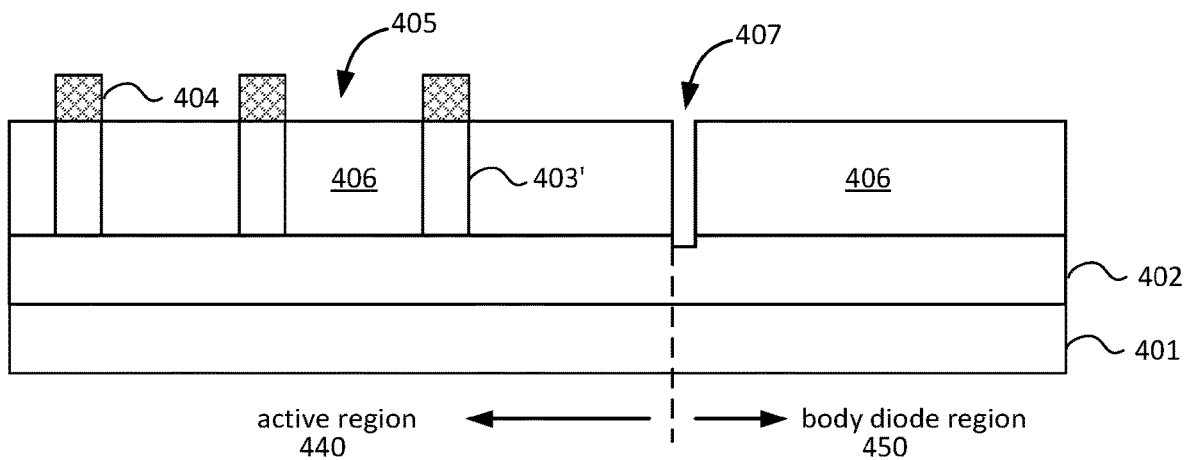
Figure 4E:
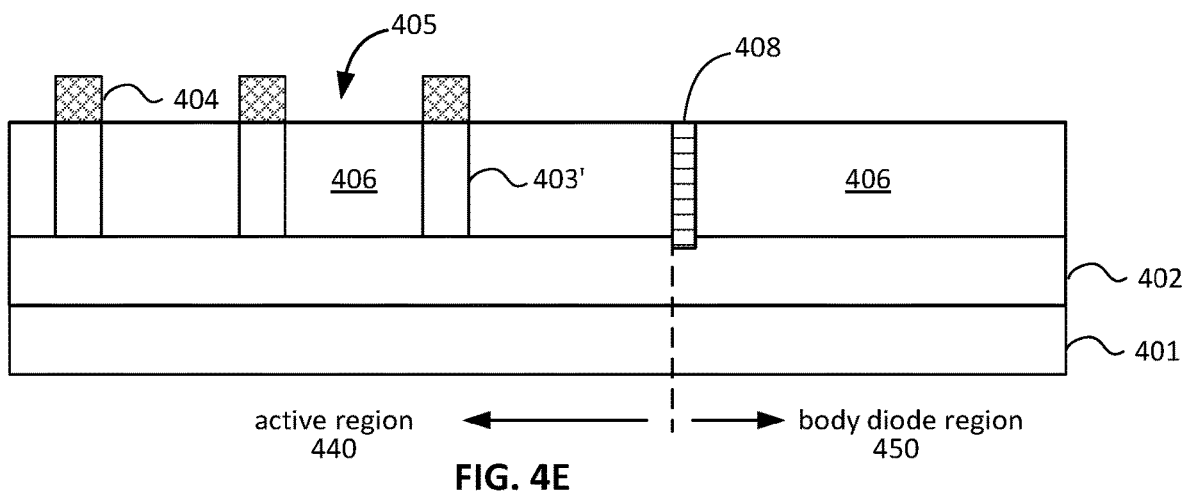
Figure 4F:
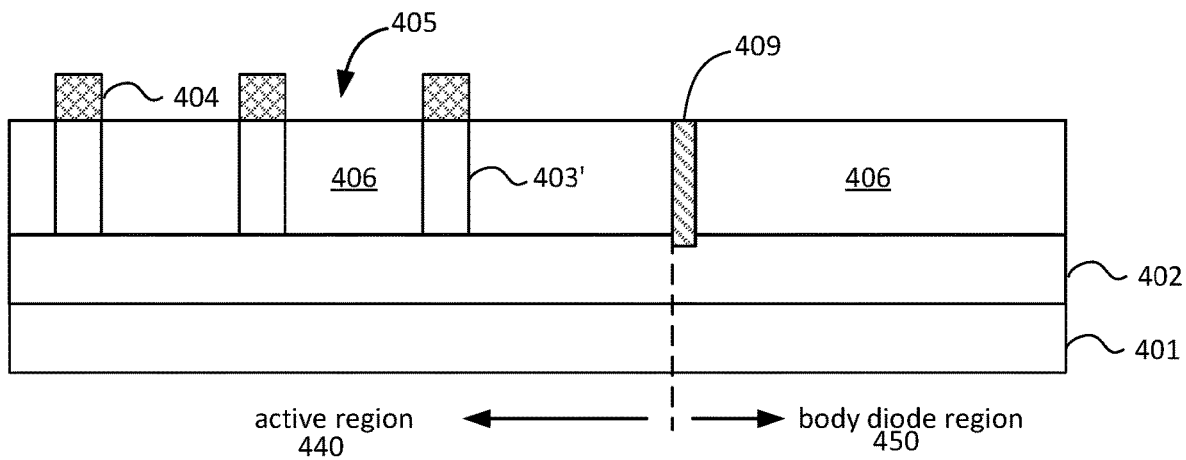
Figure 4G:
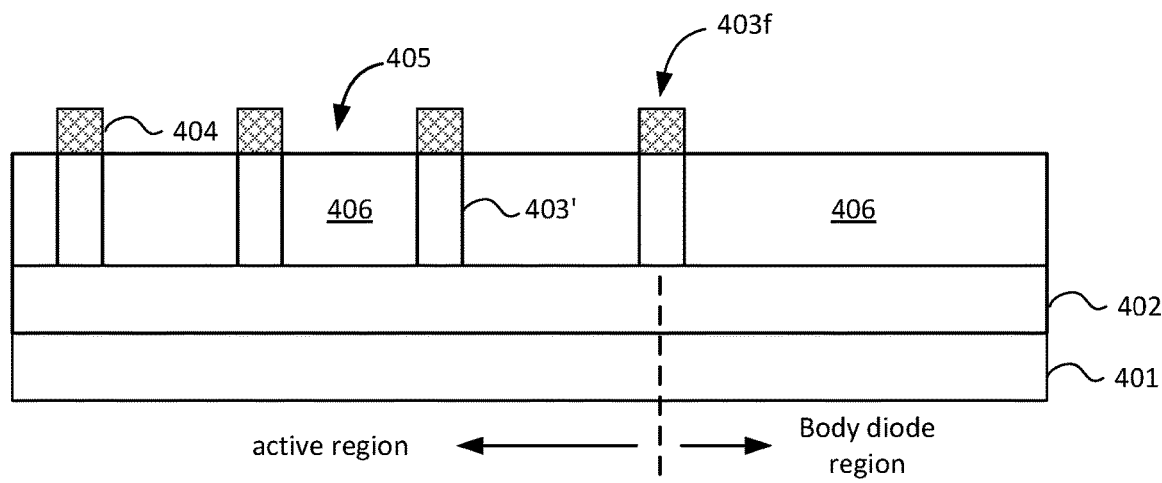

FIGS. 4D-4G are partial cross-sectional views illustrating the device structure after an isolation region 407 has been formed in the third semiconductor layer 406 (step 324). Referring to FIG. 4D, isolation region 407 divides the device structure into an active region 440 and a body diode region 450. In one embodiment, isolation region 407 may be a trench formed in third semiconductor layer 406 extending into a portion of second semiconductor layer 402, as shown in FIG. 4D. The trench may have a width that is smaller than the width of fins 403'. In one embodiment, isolation region 407 may be a trench filled with a dielectric material 408, as shown in FIG. 4E. In one embodiment, isolation region 407 may be an n-type doped region 409, as shown in FIG. 4F. In one embodiment, isolation region 407 may be a fin 403f that is floating, i.e., fin 403f is not connected to a subsequently formed source pad metal as described further below, as shown in FIG. 4G.

Figure 4H:
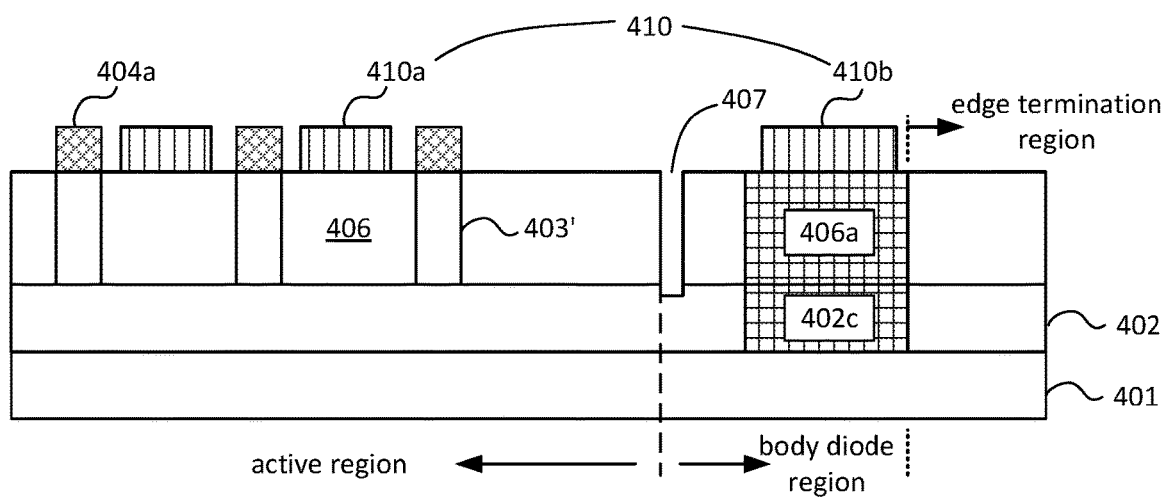

FIG. 4H is a partial cross-sectional view illustrating the device structure after the source metal layer 404a is formed on the fin (step 322) and the gate metal layer 410 is formed on the third semiconductor layer 406 (step 326). Gate metal layer 410 has a first portion 410a disposed on a portion of third semiconductor layer 406 in the active region and a second portion 410b disposed on a portion of third semiconductor layer 406 in the body diode region. It is noted that, in FIG. 4H, the isolation region is indicated by trench 407, it is however understood that the isolation may be one of the trench, the trench filled with a dielectric material, an n-type doped region, the floating fin, an ion-implanted trap-rich region which neutralizes the conduction, or a plasma-treated region where the p-type dopant has been deactivated. In one embodiment, the body diode region includes a portion 406a in the gate region 402 which forms an anode of the body diode and a portion 402c is the second semiconductor layer 402 which forms a cathode of the body diode. In one embodiment, the portion 402c forming the cathode of the body diode is thinner than the semiconductor layer 402 under the active region.

Figure 4I:
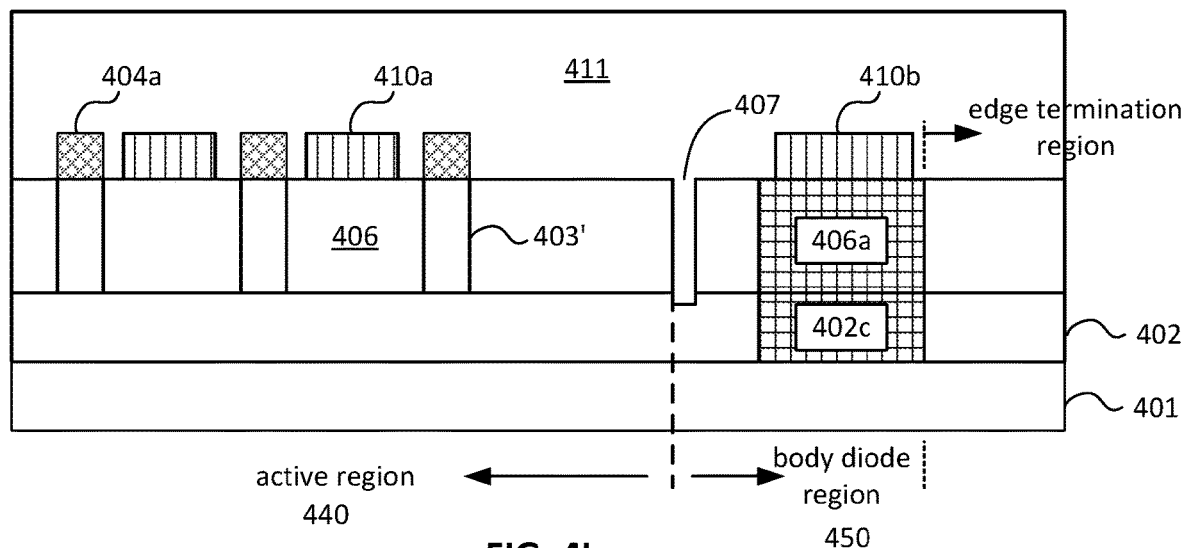

FIG. 4I is a partial cross-sectional view illustrating the device structure after the interlayer dielectric layer 411 is formed on the gate metal layer 410, the third semiconductor layer 406, and the fins 403' including the source metal layer 404 (step 328). In one embodiment, interlayer dielectric layer 411 may be formed by deposition using a plasma enhanced chemical vapor deposition (PECVD) process at a temperature of 300 degrees Celsius.

Figure 4J:
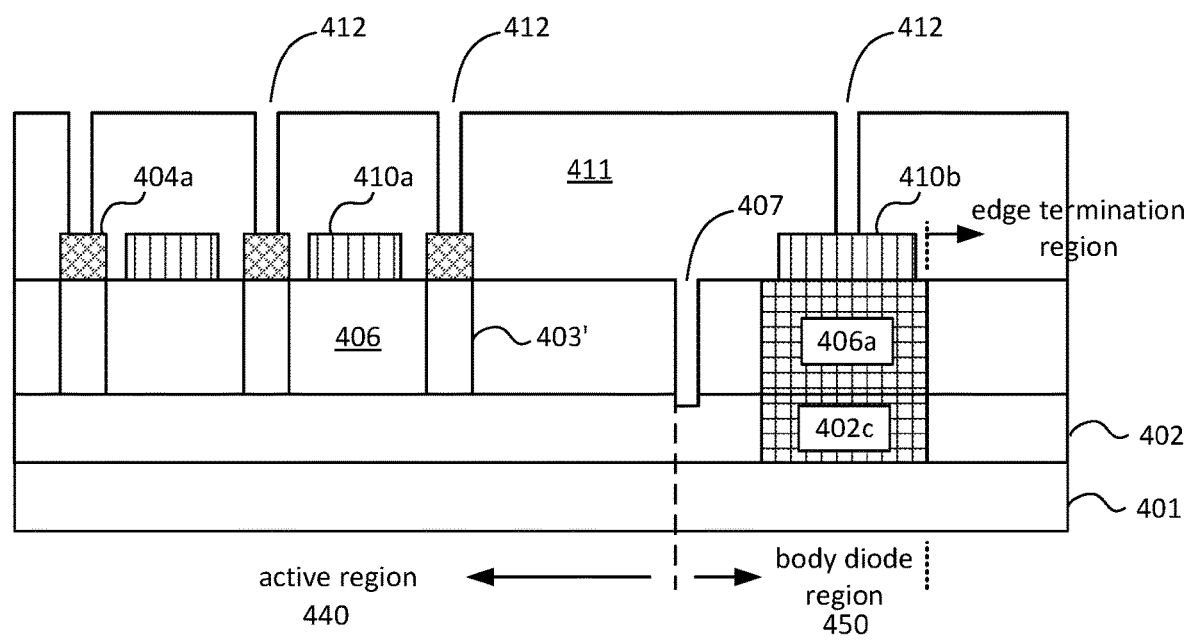

FIG. 4J is a partial cross-sectional view illustrating the device structure after through holes (via holes) 412 are formed in the interlayer dielectric layer 411. For example, a patterned photoresist is formed over the interlayer dielectric layer with photolithography processes to define locations where via holes (through holes) over the metal layer on the upper portion of the fins and on the second portion 410b of the gate metal layer in the body diode region are to be formed. After forming the via holes, the patterned photoresist is removed.

Figure 4K:
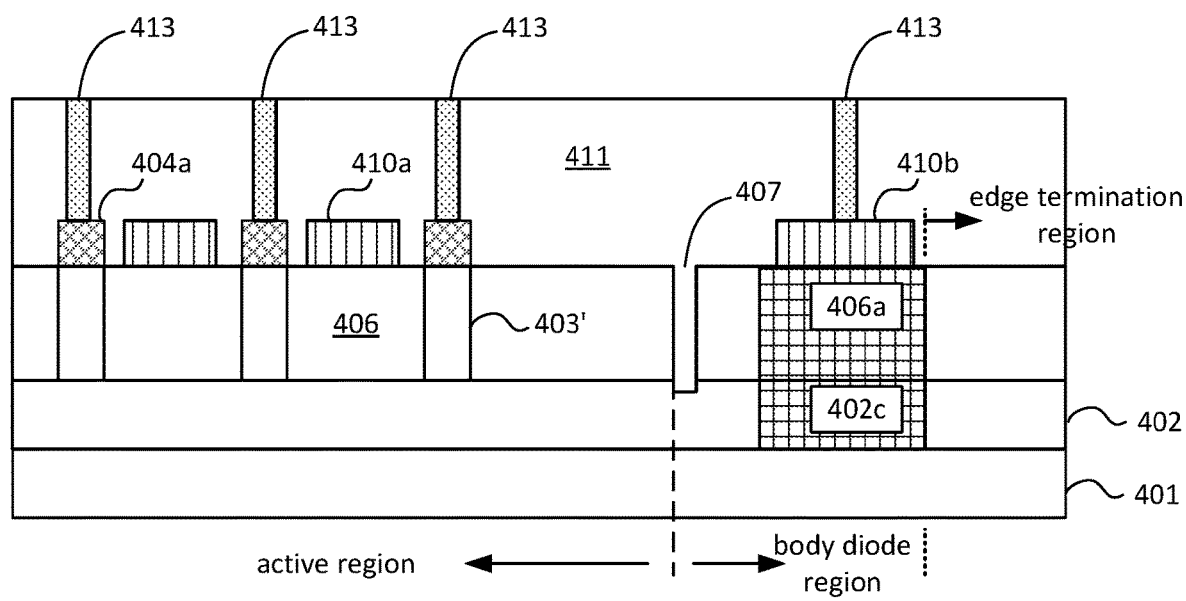

FIG. 4K is a partial cross-sectional view illustrating the device structure after the via holes (through holes) are filled with the conductive material 413.

Figure 4L:
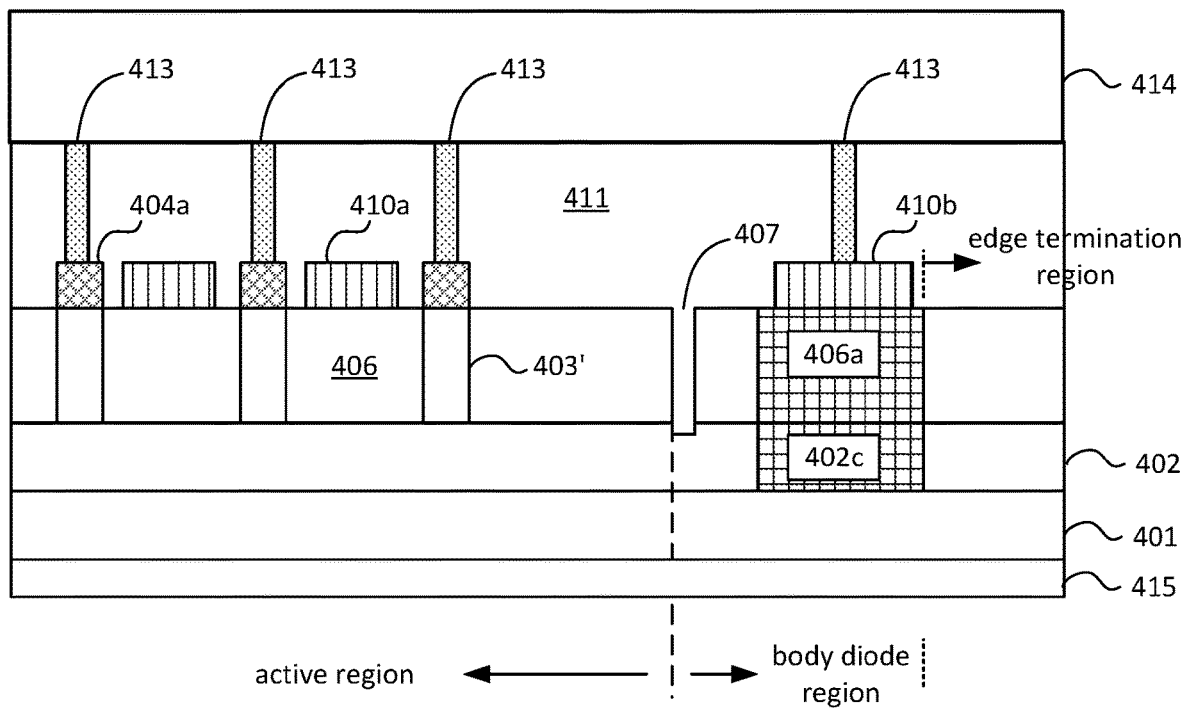

FIG. 4L is a partial cross-sectional view illustrating the device structure after the source pad metal layer 414 is formed in electrical contact with the conductive material 413. Also shown in FIG. 4L, a drain metal layer 415 is formed on the bottom surface of the n+ doped semiconductor substrate 401. The anode 406a of the body diode is connected to the source pad metal layer 414, and the cathode 402c of the body diode is connected to the drain metal layer 415. Thus, in the embodiment illustrated in FIG. 4L, a PN junction body diode is formed. Therefore, the anode of the PN junction body diode is connected to the source of the vertical FinFET device and the cathode of the PN junction body diode is connected to the drain of the vertical FinFET device. The source pad metal layer may be formed using any of a variety of processes such as sputtering, evaporation, deposition, etc. The drain metal layer may be formed using any of a variety of processes such as sputtering, evaporation, deposition, etc. A gate pad metal layer (not shown) may be formed in contact with conductive material 413 that fills through-holes 412 connected to the gate metal in the active region.

Figure 5:
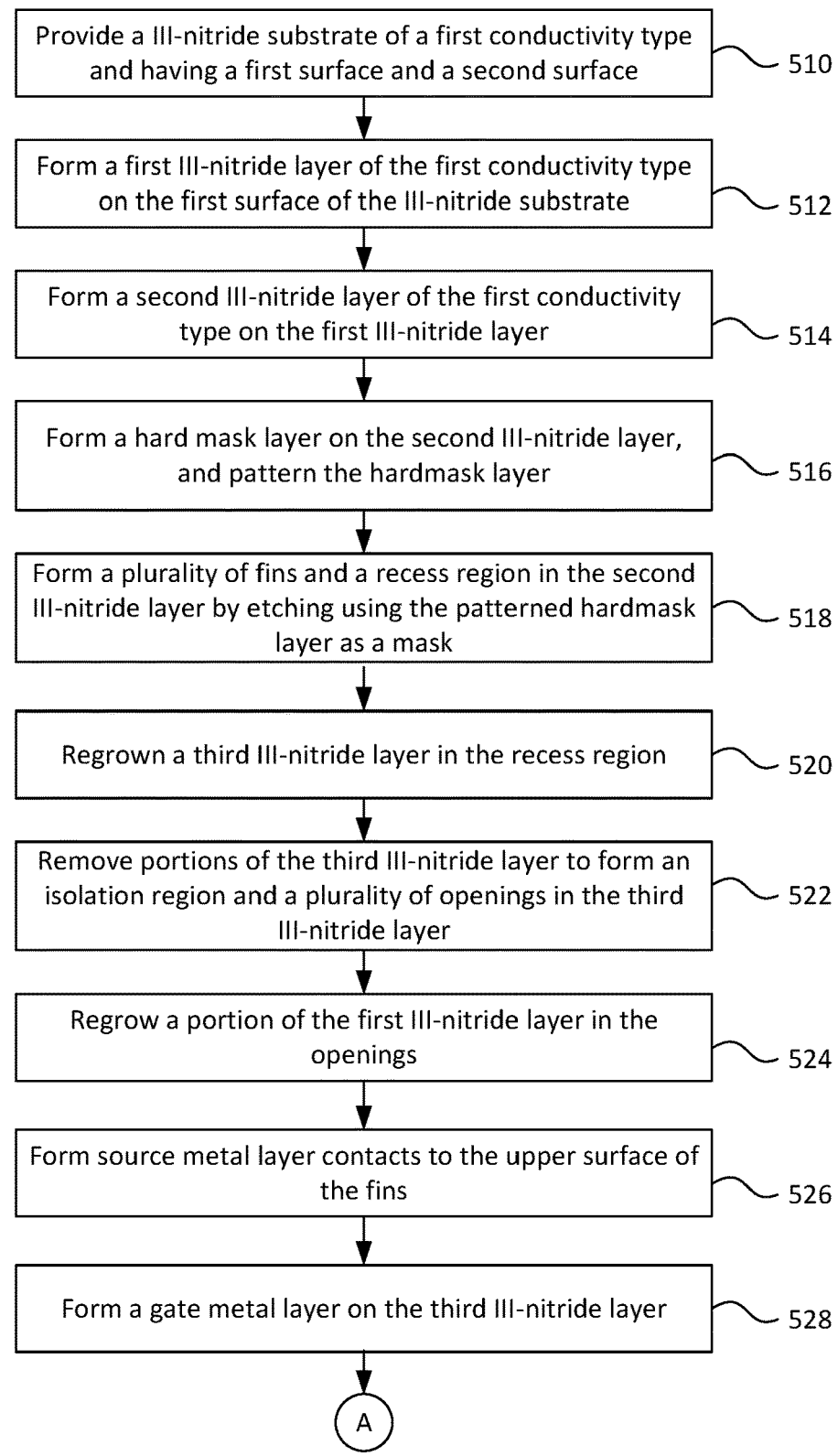
FIG. 5 is a simplified flowchart of a method of manufacturing a vertical FinFET device with an MPS diode and edge termination according to an embodiment of the present disclosure.
Figure 5:
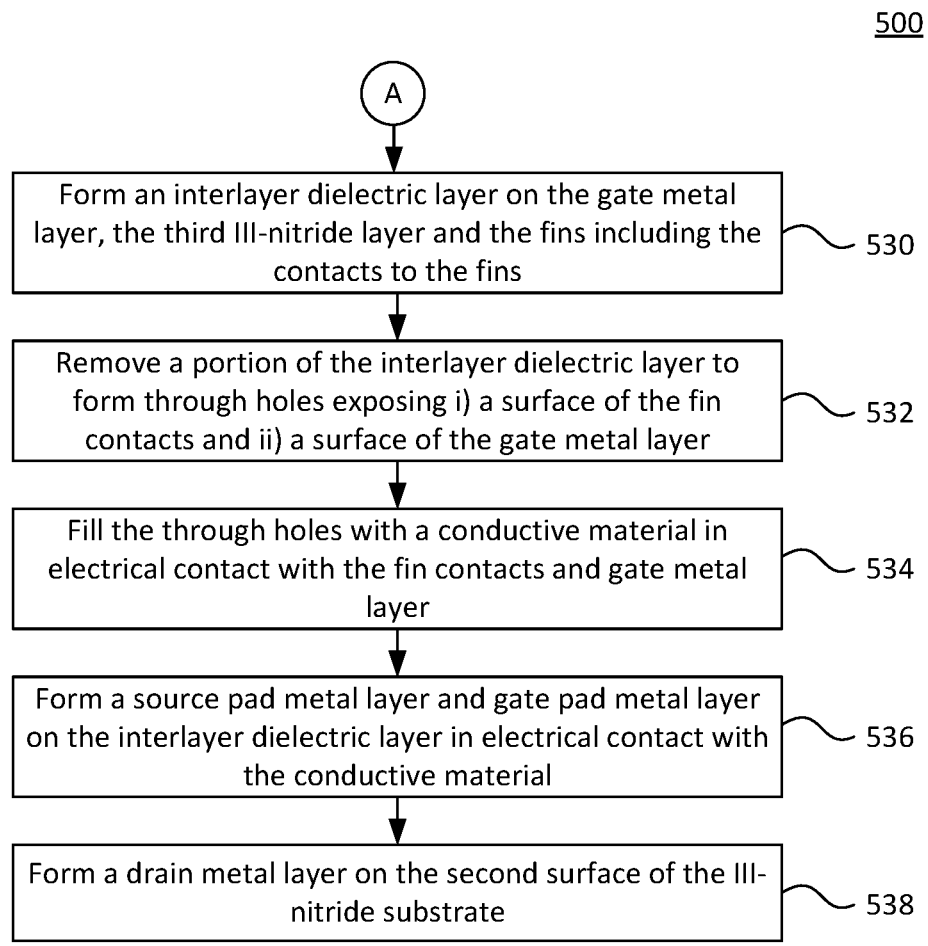

FIG. 5 is a simplified flowchart illustrating a method 500 for manufacturing a vertical FinFET device with an integrated merged P-i-N Schottky (MPS) diode and edge termination structures of the MPS diode according to an embodiment of the present disclosure. Referring to FIG. 5, method 500 may include providing a III-nitride substrate of a first conductivity type and having a first surface and a second surface opposite the first surface (510). In one embodiment, the III-nitride substrate is an n+ GaN substrate. A first III-nitride layer of the first conductivity type is epitaxially grown on the first surface of the III-nitride substrate, for example, at a temperature between 950 degrees and 1100 degrees, and can be characterized by a first dopant concentration, e.g., n-type doping with a dopant concentration of about $1\times10^{16}$ atoms/cm$^3$ (512). In some embodiments, the first III-nitride layer is a drift layer.

Method 500 further includes forming a second III-nitride epitaxial layer of the first conductivity type on the first III-nitride layer (514). In one embodiment, the second III-nitride layer is characterized by a second dopant concentration that is higher than the dopant concentration of the first III-nitride layer. In one embodiment, the second dopant concentration is about $1\times10^{17}$ atoms/cm$^3$. Method 500 further includes forming a patterned hard mask layer on the second III-nitride layer (516). In one embodiment, the patterned hard mask layer is formed by depositing and patterning a dielectric material. In one embodiment, the patterned hard mask layer consists of a source metal layer on the second III-nitride layer and a patterned hard mask layer on the source metal layer, which is used to mask the source metal layer for a subsequent metal etch in order to form a composite patterned hard mask layer. Method 500 further includes forming a plurality of semiconductor fins that are separated by a recess in the second III-nitride layer by etching using the patterned hard mask layer as a mask (518).

Method 500 further includes epitaxially regrowing a third III-nitride epitaxial layer of a second conductivity type in the recess (520). In one embodiment, the regrown III-nitride layer is a gate layer having the second conductivity type that is opposite the first conductivity type of the first and second III-nitride layers. Method 500 further includes removing portions of the third III-nitride layer to form an isolation region in the third III-nitride epitaxial layer and a plurality of openings. The isolation region divides the device into an active region having the fins and a diode region having the plurality of openings that are served to form an MPS diode and edge termination structures (522). In one embodiment, removing portions of the third III-nitride layer may be performed using an etch process (e.g., a reactive ion etching process) to form an isolation trench and the plurality of openings. In one embodiment, the isolation trench may be filled with an insulating material, such as a dielectric (silicon dioxide, silicon nitride), as shown in FIG. 4E. In another embodiment, the filled trench may be selectively doped by implanting dopant of the opposite conductivity type as the third III-nitride layer into the trench to form a vertical isolation implant layer in the third III-nitride layer, as shown in FIG. 4F.

Method 500 further includes epitaxially regrowing a portion of the first III-nitride layer into the plurality of openings (524), forming source metal layer contacts to the top of the fins (526), and forming a gate metal layer on the third III-nitride epitaxial layer (528). The gate metal layer has a first portion disposed on the active region of the third III-nitride layer containing the semiconductor fins and a second portion disposed on the diode region including edge termination structures. Method 500 further includes forming an interlayer dielectric layer covering the gate metal layer and the third III-nitride epitaxial layer (530). Method 500 further includes masking and etching the interlayer dielectric layer to form through-holes exposing an upper surface of the source metal layer on the second III-nitride layer and an upper surface of the second portion of the gate metal layer disposed on the opposite side of the isolation region, removing a portion of the interlayer dielectric layer by etching using the patterned hard mask layer as a mask to form through-holes exposing the source metal layer and the gate metal layer (532), and filling the through holes with a conductive material that is in electrical contact with the source metal layer (534).

Method 500 further includes forming a source pad metal layer on the interlayer dielectric layer that is in electrical contact with the conductive material (536) and forming a drain metal layer on the second surface of the III-nitride substrate (538).

It should be understood that the specific steps illustrated in FIG. 5 provide a particular method of fabricating a vertical FinFET device with an integrated MPS diode and edge termination structures of the MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual steps. Furthermore, additional steps may be added or removed depending on a particular application. One of ordinary skill in the art would recognize may variations, modifications, and alternatives.

Figure 6A:
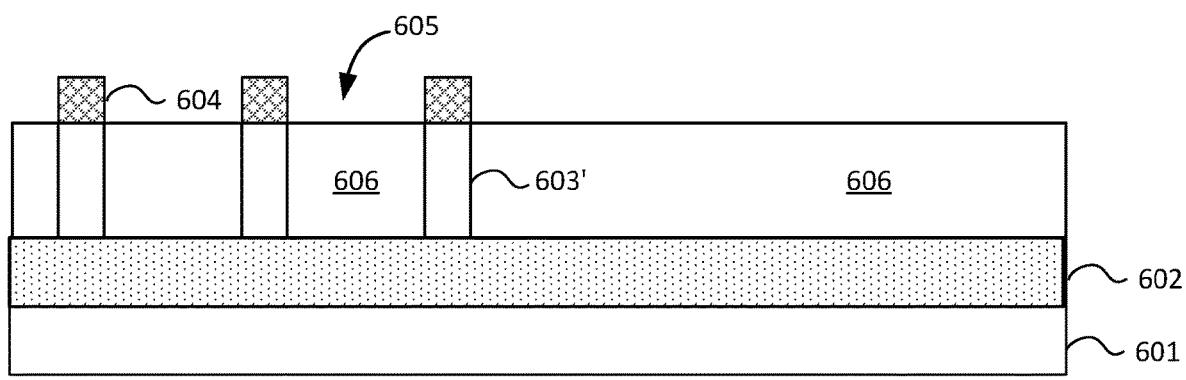
FIGS. 6A through 6H are cross-sectional views illustrating intermediate stages of a method of manufacturing a vertical FinFET device with an integrated MPS body diode according to an embodiment of the present disclosure.

FIG. 6A through 6H illustrate partial cross-sectional views of a vertical FinFET device structure having a source, gate, drift region, MPS diode, and edge termination structures during stages of a manufacturing method according to an embodiment of the present invention. For reason of brevity, the method is described as providing a III-nitride structure having a III-nitride substrate 601, a first III-nitride layer 602 on III-nitride substrate 601, a plurality of fins 603' on first III-nitride layer 602, a patterned hard mask layer 604 on fins 603', a third III-nitride layer 606 between the fins, as shown in FIG. 6A (steps 510 through 520). In one embodiment, third III-nitride layer 606 has an upper surface that is flush with the upper surface of fins 603'. In one embodiment, III-nitride substrate 601 is an n+ GaN substrate, first III-nitride layer 602 is an n-GaN layer that serves as a drift layer, fins 603' include an n GaN material as a second III-nitride layer on first III-nitride layer 602, and third III-nitride layer 606 is a p GaN layer. In one embodiment, patterned hard mask layer 604 may include a metal, metal alloy, or metal compound (e.g., TiN).

Figure 6B:
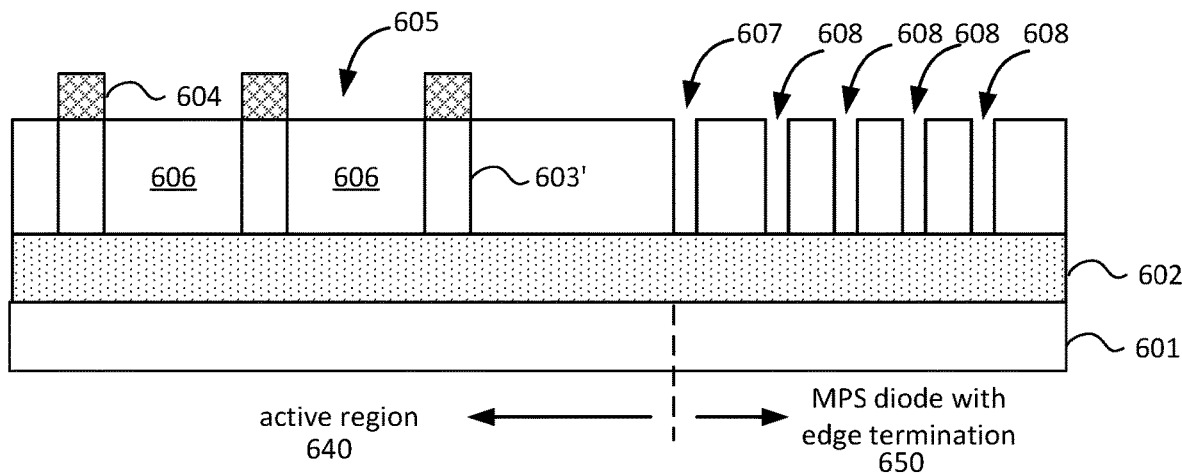

FIG. 6B illustrates portions of third III-nitride layer 606 as removed by etching to form an isolation trench 607 and a plurality of openings 608 exposing a surface of first III-nitride layer 602 (step 522). Isolation trench 607 divides the vertical FinFET device structure into an active region 640 and an MPS diode region 650 with edge termination structures. Removing portions of third III-nitride layer 606 may be performed by etching using an etch mask (not shown). In one embodiment, the etching process may be terminated at the interface between the third III-nitride layer 606 and the first III-nitride layer 602.

Figure 6C:
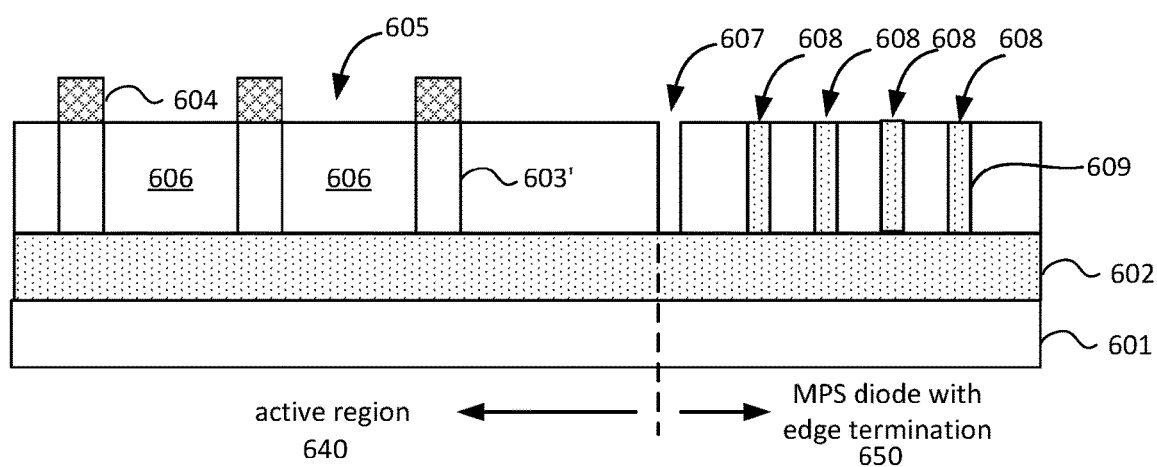

FIG. 6C illustrates an epitaxial regrowth portion of the material of first III-nitride layer 602 in the openings 608 to obtain an epitaxial regrown III-nitride layer 609 (step 524). In some embodiments, the height of the epitaxial regrown III-nitride layer 609 may be less than the height of the third III-nitride layer 606. In other embodiments, the height of the epitaxial regrown III-nitride layer 609 may be the same as the height of the third III-nitride layer 606. One of skill in the art would recognize may variations, modifications, and alternatives.

Figure 6D:
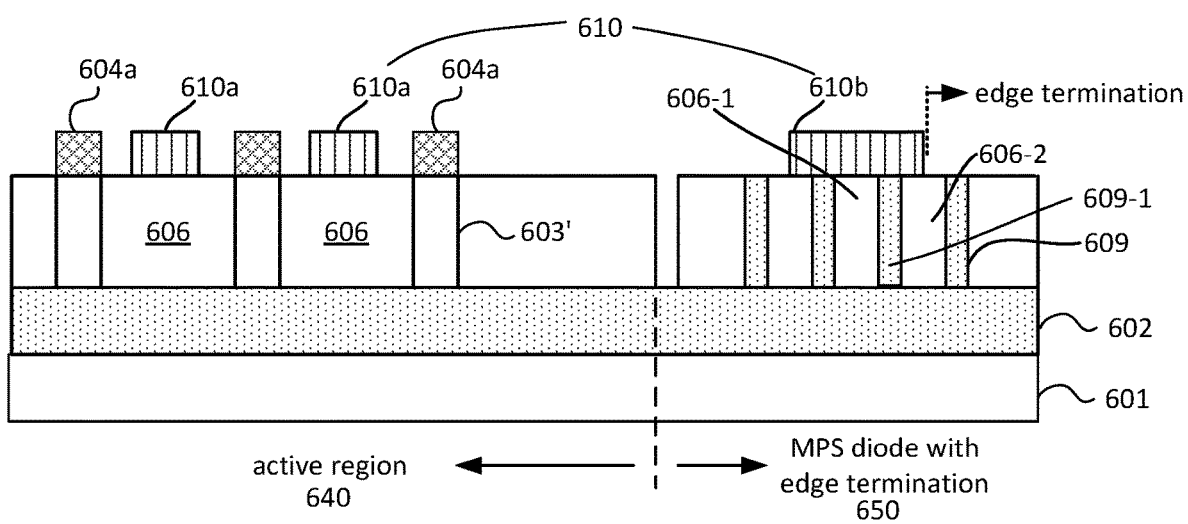

FIG. 6D illustrates the formation of a source metal layer 604a on the fins 603' and a gate metal layer 610 on a portion 610a of the third III-nitride layer disposed between the fins and on a portion 610b of the third III-nitride layer disposed between the epitaxial regrown III-nitride layer 609 (step 526). Source metal layer 604a may include the source metal layer in composite hard mask 604, and it may be one or more layers of metal and/or alloys. Gate metal layer 610 may be one or more layers of metal and/or alloys. Portion 610b creates a Schottky barrier layer with epitaxially regrown III-nitride layer 609-1 and an ohmic contact with regions 606-1 of third III-nitride layer 606. Remaining portions 606-2 provide junction extension and/or edge termination for the MPS diode.

Figure 6E:
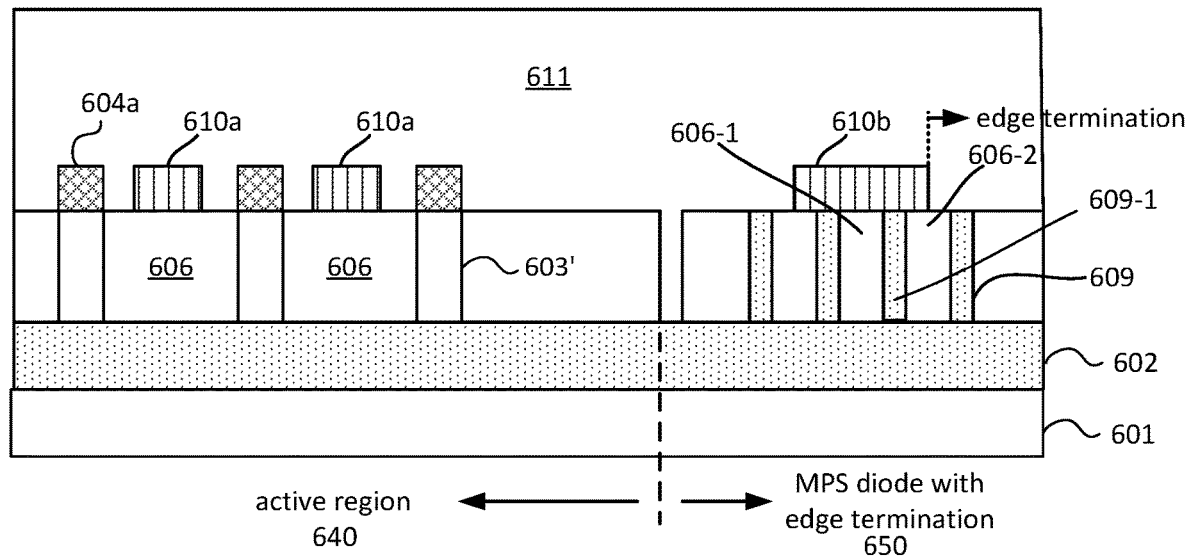

FIG. 6E illustrates the device structure after forming an interlayer dielectric layer 611 on gate metal layer 610 (including 610a, 610b), third semiconductor layer 606, fins 603', and patterned metal layer 604 (step 528). In one embodiment, interlayer dielectric layer 611 may be formed by deposition using a plasma enhanced chemical vapor deposition (PECVD) process at a temperature of 300 degrees Celsius.

Figure 6F:
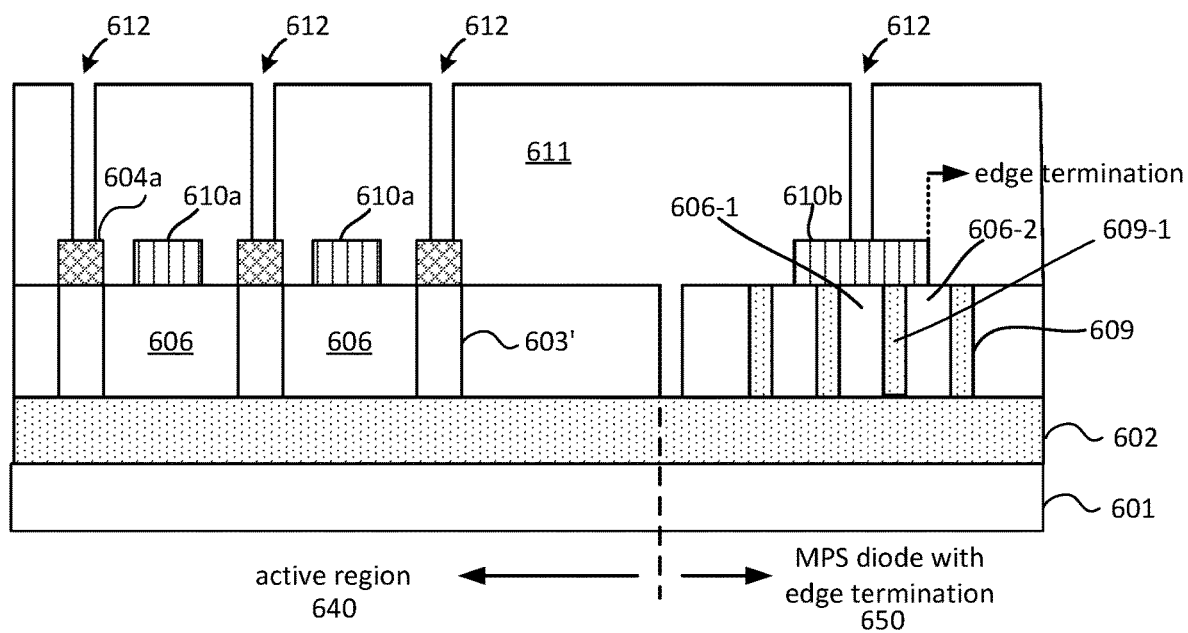

FIG. 6F illustrates the device structure after forming through holes 612 extending through interlayer dielectric layer 611. In one embodiment, a patterned photoresist is formed over the interlayer dielectric layer with well-known photolithography processes to define locations where through holes over the metal layer on the upper portion of the fins and on the second portion 610b of the gate metal layer in the MPS diode are to be formed. After forming the through holes, the patterned photoresist is removed.

Figure 6G:
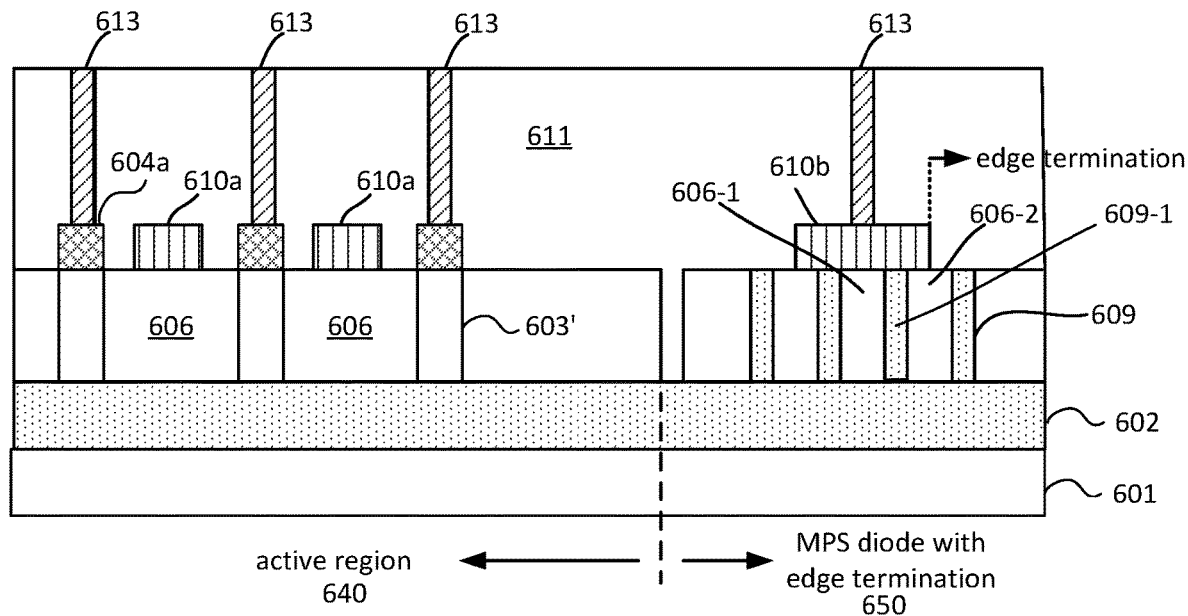

FIG. 6G is a partial cross-sectional view illustrating the device structure after the through holes are filled with a conductive material 613.

Figure 6H:
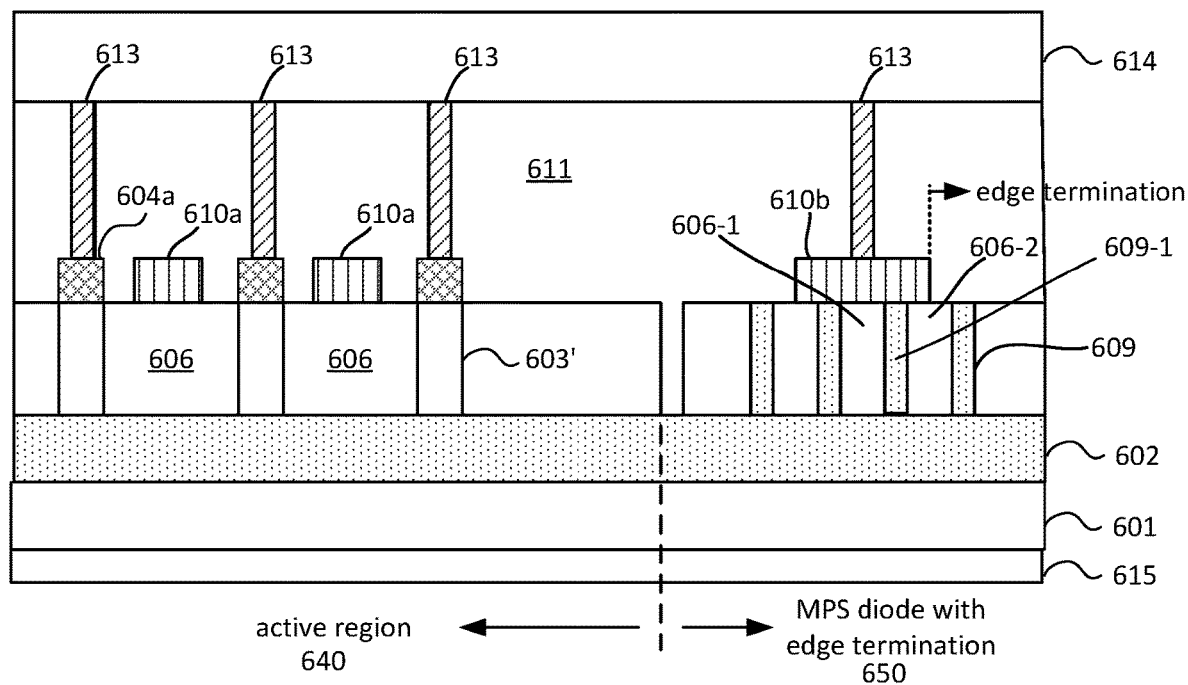

FIG. 6H is a partial cross-sectional view illustrating the device structure after the source pad metal layer 614 is formed in electrical contact with the conductive material 613. Also shown in FIG. 6H, a drain metal layer 615 is formed on the bottom surface of the n+ doped semiconductor substrate 601.

Figure 7:
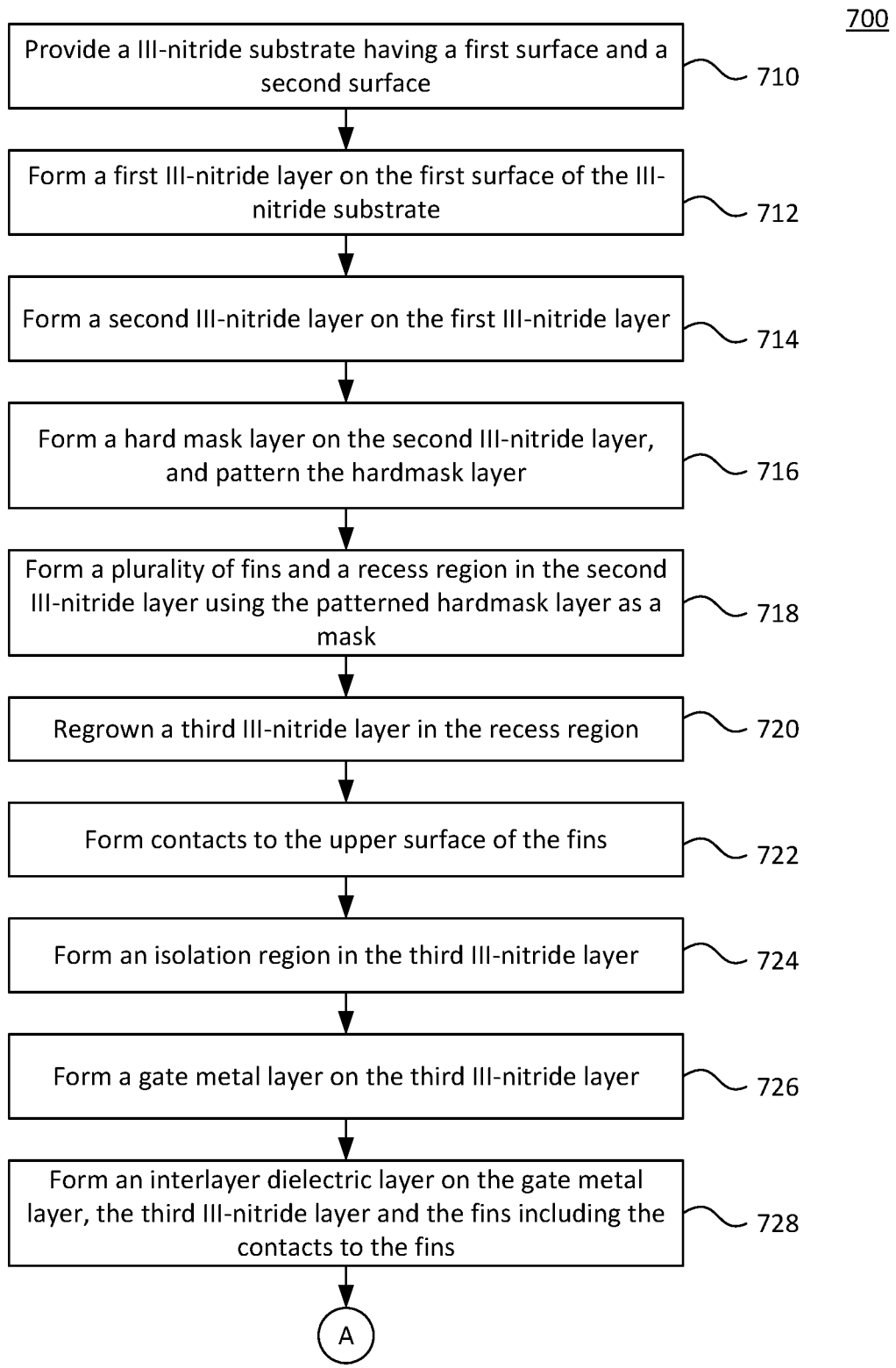
FIG. 7 is a simplified flowchart illustrating a method for manufacturing a vertical FinFET device with an integrated MPS diode connected between a source and drain of the vertical FinFET device and edge termination structures of the MPS diode according to an embodiment of the present disclosure.
Figure 7:
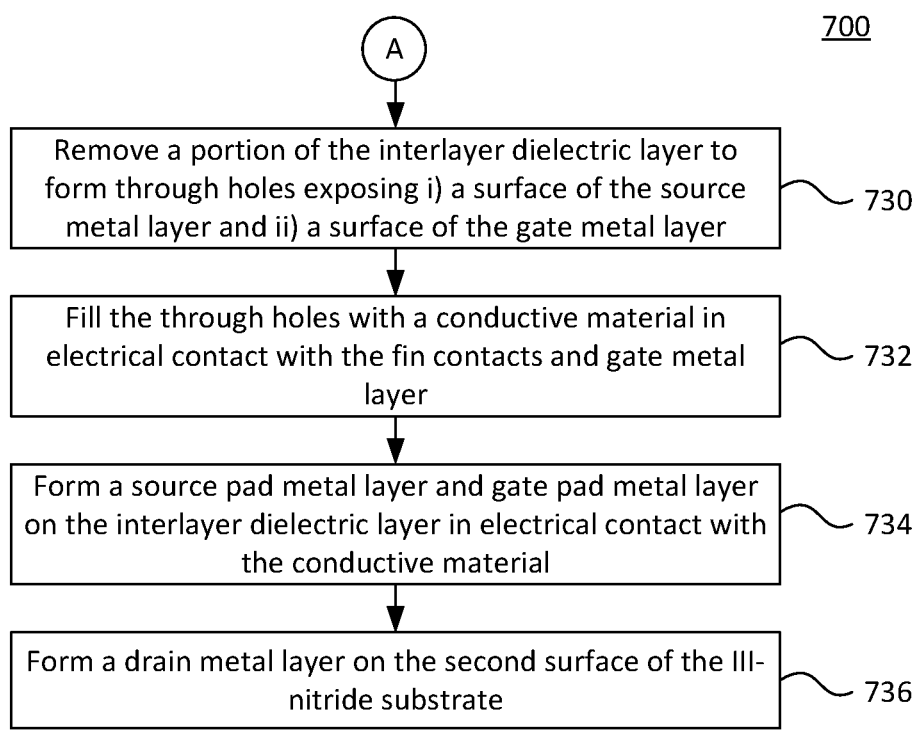

FIG. 7 is a simplified flowchart illustrating a method 700 for manufacturing a vertical FinFET device with an integrated merged P-i-N Schottky (MPS) diode connected between a source and drain of the vertical FinFET device and edge termination structures of the MPS diode according to an embodiment of the present disclosure. Referring to FIG. 7, method 700 may include providing a III-nitride substrate (710) having a first surface and a second surface opposite the first surface. In an embodiment, the III-nitride substrate is an n+ GaN substrate. A first III-nitride layer is epitaxially grown on the first surface of the III-nitride substrate, for example, at a temperature between 950 degrees and 1100 degrees, and can be characterized by a first dopant concentration, e.g., n-type doping with a dopant concentration of about $1\times10^{16}$ atoms/cm$^3$ (712). In some embodiments, the first III-nitride layer is a drift layer. Method 700 further includes forming a second III-nitride epitaxial layer on the first III-nitride layer (714). In an embodiment, the second III-nitride layer is characterized by a second dopant concentration that is higher than the dopant concentration of the first III-nitride layer. In an embodiment, the second dopant concentration is about $1\times10^{17}$ atoms/cm$^3$. In an embodiment, a region with a graded dopant concentration is formed between the first III-nitride layer and a constant-dopant-concentration region in the second III-nitride layer. In some embodiments, the second III-nitride epitaxial layer is a fin layer. Method 700 further includes forming a patterned hard mask layer on the second III-nitride layer (716). In one embodiment, the patterned hard mask layer is formed by depositing and patterning a dielectric material. In one embodiment, the patterned hard mask layer consists of a source metal layer on the second III-nitride layer, and a patterned hard mask layer formed on the source metal layer, which is used as a mask to etch the source metal layer creating a composite patterned hard mask layer. Method 700 further includes forming a plurality of semiconductor fins that are separated by a recess region in the second III-nitride layer using the patterned hard mask layer as a mask (718).

Method 700 further includes regrowing a third III-nitride epitaxial layer in the recess region (720). In an embodiment, the regrown III-nitride layer is a gate layer and is characterized by a conductivity type that is opposite the conductivity type of the first and second III-nitride layers. Method 700 further includes forming contacts to the top of the n-type fin (722). In an embodiment, the contacts are self-aligned. In an embodiment, the source metal layer of the patterned hard mask layer makes electrical contact to the top of the n-type fins. Method 700 further includes forming an isolation region in the third III-nitride epitaxial layer (724). In an embodiment, the isolation region may be formed by carrying out an etch process (e.g., a reactive ion etching process) to form an isolation trench. In one embodiment, the isolation trench may be filled with an insulating material, such as a dielectric (silicon dioxide, silicon nitride). Referring to FIG. 1, the isolation trench may be the isolation region 107 that surrounds the fins 103. In another embodiment, method 700 may include selectively implanting an n-type dopant into the isolation trench to form a vertical isolation implant layer in the third III-nitride layer. In another embodiment, method 700 may include selectively implanting nitrogen, argon or helium to form traps which neutralize the p-GaN doping, and form an implanted isolation trench. In another embodiment, method 700 may include selectively treating the third III-nitride epitaxial layer with a plasma (e.g., a hydrogen plasma) to locally deactivate the dopant in the third III-nitride epitaxial layer. In yet another embodiment, the isolation region may include a fin that is floating, i.e., the floating fin is not connected to the source pad layer that will be formed in subsequent process steps.

Method 700 further includes forming a gate metal layer on the third III-nitride epitaxial layer (726). Referring to FIG. 1, the gate metal layer has a first portion 110a disposed on a first portion of the third III-nitride layer that is on one side of the isolation region 107 and surrounds the semiconductor fins and a second portion 110b disposed on a second portion of the third III-nitride layer that is on the opposite side of the isolation region and does not have semiconductor fins. Method 700 further includes forming an interlayer dielectric layer (e.g., interlayer dielectric layer 111) covering the source metal layer, the gate metal layer and the third III-nitride epitaxial layer (728). Method 700 further includes masking and etching the interlayer dielectric layer to form through-holes exposing an upper surface of the source metal layer on the second III-nitride layer and an upper surface of the second portion of the gate metal layer disposed on the opposite side of the isolation region. Thus, method 700 includes etching the interlayer dielectric layer using a patterned hard mask layer as a mask to form through-holes exposing the source metal layer (source metal layer 104 on fins 103) and the gate metal layer (730) and filling the through holes with a conductive material to form a plurality of vias, which are in contact with the source metal layer and the gate metal layer (732).

Method 700 further includes forming a source pad metal layer on the interlayer dielectric layer which is in electrical contact with the conductive material in contact with the source metal layer and a gate pad metal layer on the interlayer dielectric with is in electrical contact with the conductive material in contact with the gate metal layer (734) and forming a drain metal layer on the second surface of the III-nitride substrate (736).

It should be understood that the specific steps illustrated in FIG. 7 provide a particular method of fabricating a vertical FinFET device with an integrated MPS diode connected between a source and drain of the vertical FinFET device and edge termination structures of the MPS diode according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual steps. Furthermore, additional steps may be added or removed depending on a particular application. One of ordinary skill in the art would recognize may variations, modifications, and alternatives.

Figure 8A:
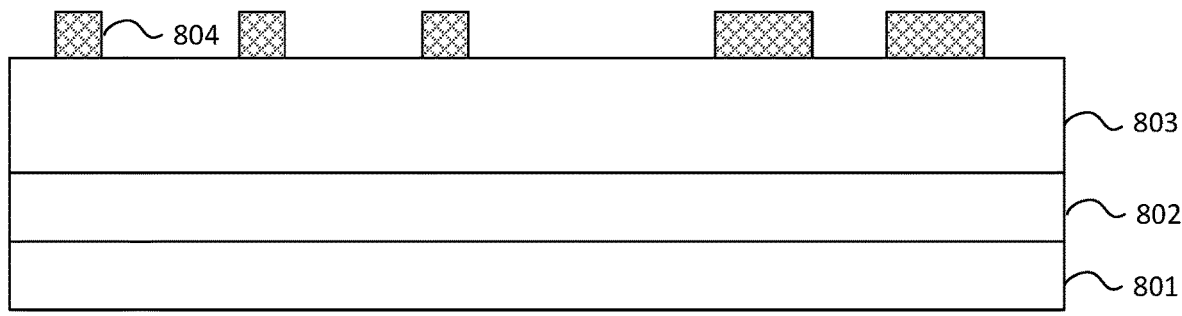
FIGS. 8A through 8L illustrate partial cross-sectional views of a vertical FinFET device structure having a source, gate, drift region, MPS diode, and edge termination structures during stages of a manufacturing method according to an embodiment of the present disclosure.

FIGS. 8A through 8L illustrate partial cross-sectional views of a vertical FinFET device structure having a source, gate, drift region, MPS diode, and edge termination structures during stages of a manufacturing method according to an embodiment of the present disclosure. FIG. 8A is a partial cross-sectional view illustrating an n+ doped semiconductor substrate 801, an n-doped semiconductor layer 802 epitaxially grown on the n+ doped semiconductor substrate 801, and an n− doped semiconductor layer 803 epitaxially grown on the n− doped semiconductor layer 802. In one embodiment, the n− doped semiconductor layer 802 forms the drift region of the device, and is doped with n-type dopants such as silicon. In one embodiment, a patterned hard mask layer (804) is formed on the n-doped semiconductor layer 803. In one embodiment, a metal layer (not shown) is formed on the n-doped semiconductor layer 803, and a hard mask layer (not shown) is formed and patterned on the metal layer, and an etch process is performed on the metal layer using the patterned hard mask layer as a mask to obtain a composite patterned hard mask including the patterned metal layer. In one embodiment, the patterned hard mask layer may include silicon dioxide or silicon nitride. In one embodiment, the patterned hard mask layer may be formed by PECVD. In another embodiment, the patterned hard mask layer may be formed using RIE with F-based chemistry. In one embodiment, the n+ doped semiconductor substrate may be an n+ doped III-nitride substrate with n-type dopants in the range of about $5 \times 10^{17}$ atoms/cm$^3$ to about $1 \times 10^{19}$ atoms/cm$^3$. In one embodiment, the drift region may have a net n-type dopant concentration in the range of about $1 \times 10^{16}$ to $1 \times 10^{17}$ atoms/cm$^3$. In one embodiment, the n− doped semiconductor layer 803 may have a dopant concentration in the range of about $1 \times 10^{17}$ to $1 \times 10^{18}$ atoms/cm$^3$. In one embodiment, the metal layer may include TiN. These steps correspond to steps 710 to 716 of the method 700 shown in FIG. 7.

Figure 8B:
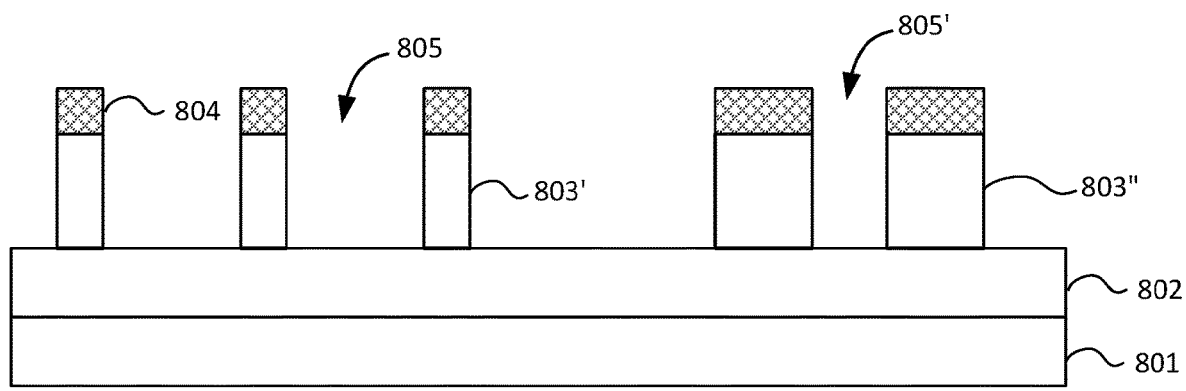

FIG. 8B is a partial cross-sectional view illustrating the device structure after the etch process has been performed to obtain a plurality of semiconductor fins 803' that are separated by a recess region 805 (step 718). It is noted that the bottom of the trench between the fins may have a shape different from the shape shown in FIG. 8B after the etch process. Embodiments of the present invention are described herein with reference to cross-section illustrations that are schematic illustrations of idealized embodiments and intermediate structures of the invention. The thickness of layers and regions in the drawings may not be drawn to scale for purposes of clarity. Variations from the shapes of the illustrations as a result, for example, of manufacturing techniques and/or tolerances, are expected. Thus, embodiments of the invention should not be construed as limited to a particular shapes of regions illustrated herein, but are to include deviations in shapes that result from manufacturing. In the following drawings, the bottom portion of the fins are shown as having a 90 degrees angle with the surface of the drift region, i.e., the fins are shown as having a cross-sectional rectangular shape. It is understood that the bottom portion of the fins may have rounded or curved features. Thus, the regions illustrated in the figures are schematic in nature and their shapes are not intended to illustrate the actual shape of a region of the device and are not intended to limit the scope of the invention. In one embodiment, the depth of the recess region 805 may be different in different regions of the device. In one embodiment, the depth of the recess region 805' in the region where the MPS diode is subsequently formed (see e.g., FIG. 8D) may be larger or smaller than the depth of the recess region 805 in the active region of the vertical FET. In one embodiment the width of fins 803" in the region where the MPS diode is subsequently formed may be wider than the fins 803' in the active area of the FinFET device.

In one embodiment, after forming recess region 805, a cleaning process and/or a pre-cleaning processes are carried out using a TMAH solution.

Figure 8C:
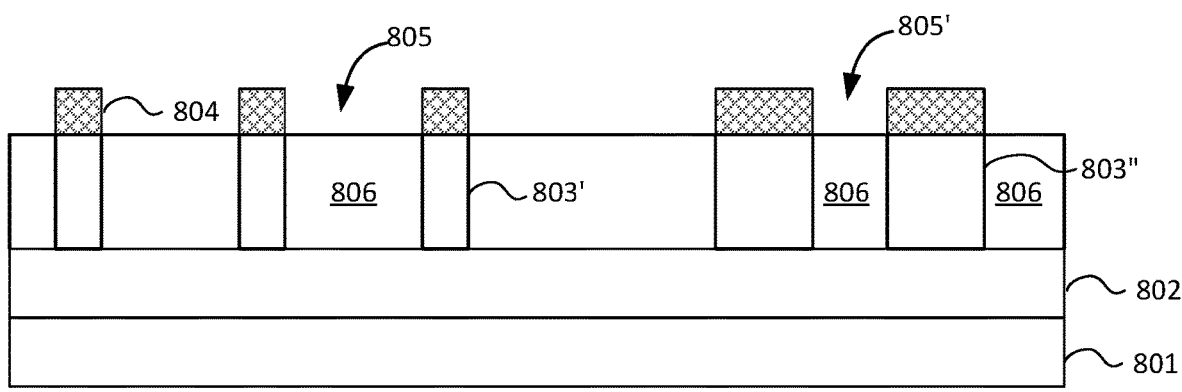

FIG. 8C is a partial cross-sectional view illustrating the device structure after the third semiconductor layer 806 has been epitaxially regrown in the recess region (step 720). In one embodiment, third semiconductor layer 806 may include a p-type III-nitride layer that is epitaxially and uniformly grown in the recess region up to a thickness that is substantially planar to the bottom of hard mask layer 804. In one embodiment, the p-type III-nitride layer may be doped with Mg with a dopant concentration of about $1 \times 10^{19}$ atoms/cm$^3$. In one embodiment, an annealing process may be carried out to activate the Mg dopant atoms in an amount of greater than 10 percent by weight.

Figure 8D:
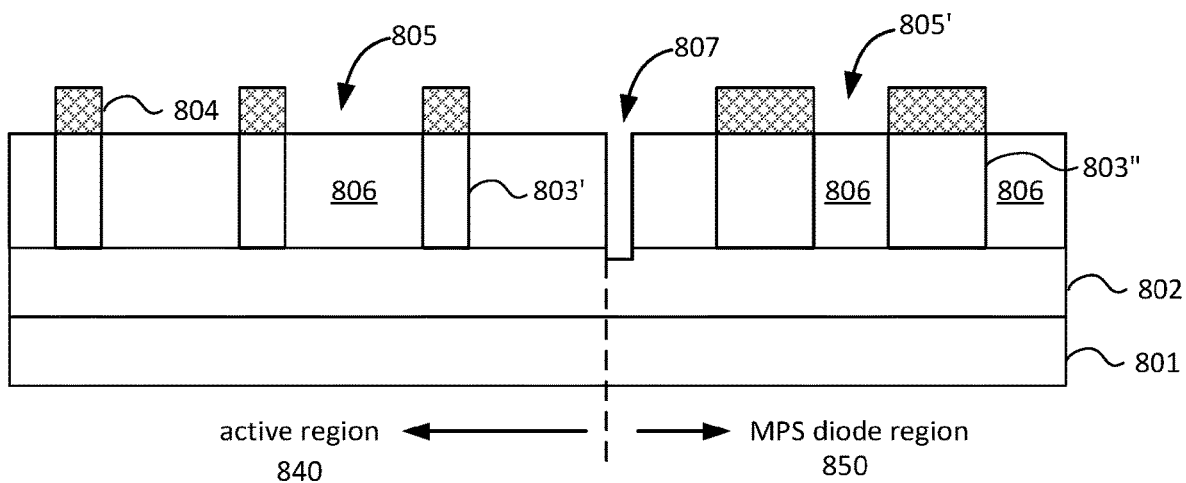
Figure 8E:
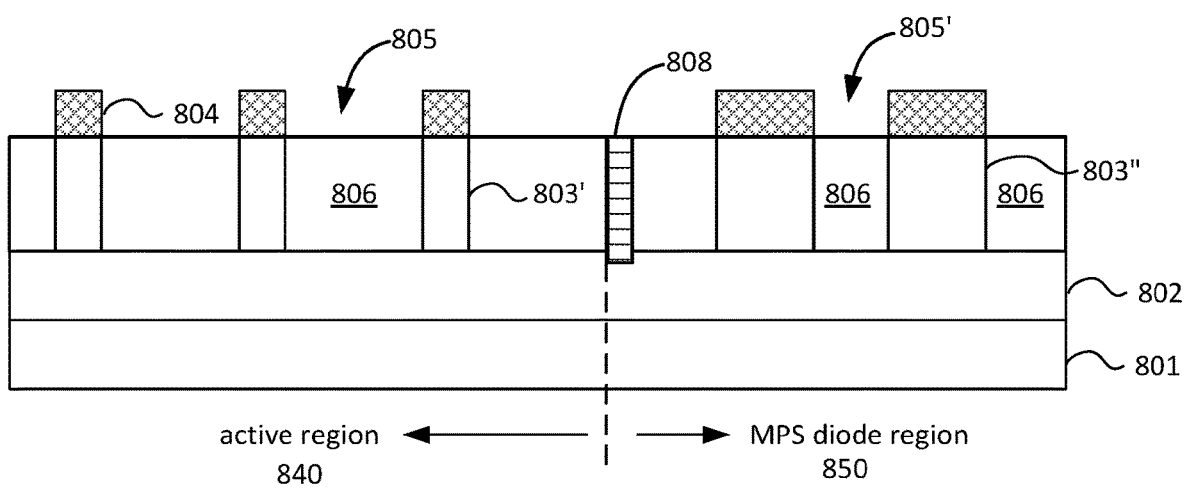
Figure 8F:
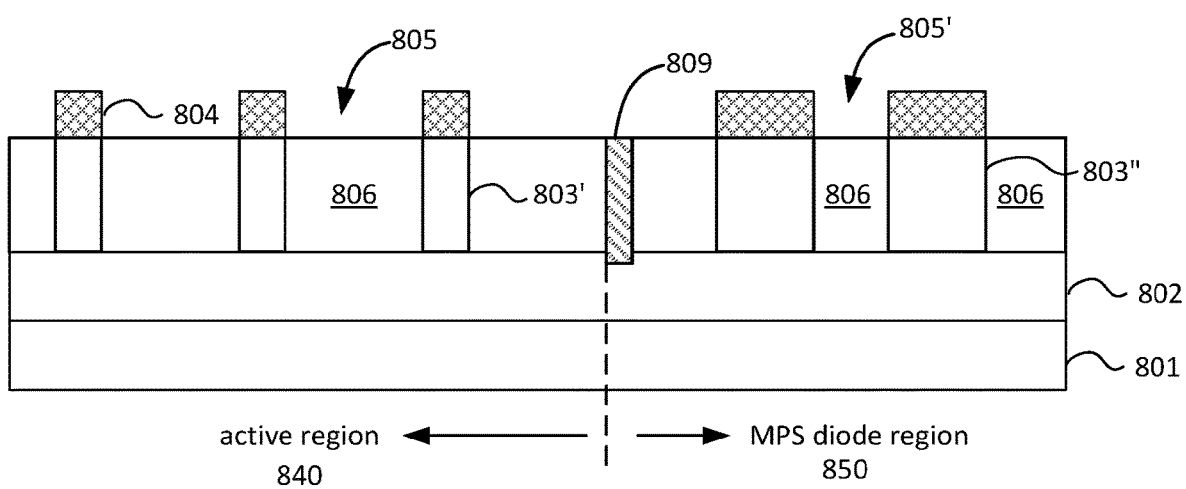
Figure 8G:
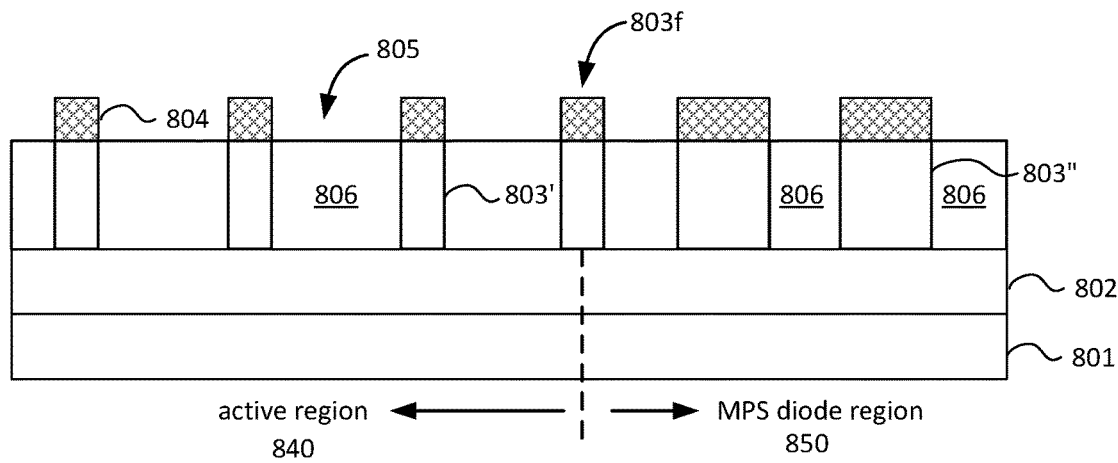

FIG. 8D is a partial cross-sectional view illustrating the device structure after an isolation region 807 has been formed in the third semiconductor layer 806 (step 724). Referring to FIG. 8D, isolation region 807 divides the device structure into an active region 840 and an MPS diode region 850. In one embodiment, isolation region 807 may be a trench formed in third semiconductor layer 806 extending into a portion of second semiconductor layer 802, as shown in FIG. 8D. The trench may have a width that is smaller than the width of fins 803'. In one embodiment, isolation region 807 may be a trench filled with a dielectric material 808, as shown in FIG. 8E. In one embodiment, isolation region 807 may be an n-type doped region 809, as shown in FIG. 8F. In one embodiment, isolation region 807 may be a fin 803f that is floating, i.e., fin 803f is not connected to a subsequent formed source pad metal as described further below, as shown in FIG. 8G.

Figure 8H:
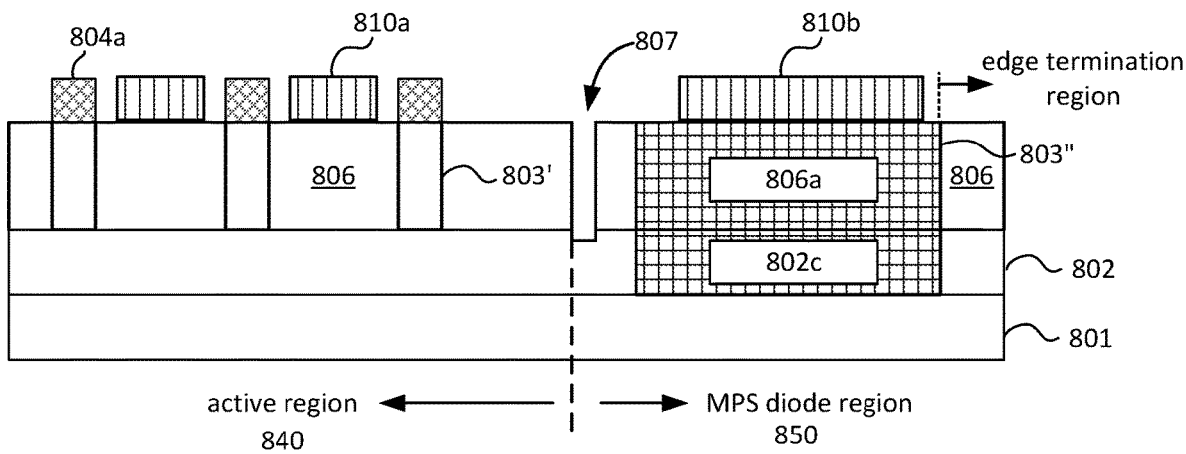

FIG. 8H is a partial cross-sectional view illustrating the device structure after the source metal layer 804a is formed on the fin (step 722) and the gate metal layer 810 is formed on the third semiconductor layer 806 (step 726). Gate metal layer 810 has a first portion 810a disposed on a portion of third semiconductor layer 806 in the active region and a second portion 810b disposed on a portion of third semiconductor layer 806 in the MPS diode region. Source metal layer 804a may include the source metal layer in composite hard mask 804, and it may be one or more layers of metal and/or alloys. Gate metal layer 810 may be one or more layers of metal and/or alloys. Portion 810b creates a Schottky barrier layer with fins 803" and an ohmic contact with third III-nitride layer 806. It is noted that, in FIG. 8H, the isolation region is indicated by trench 807, it is however understood that the isolation may be one of the trench, the trench filled with a dielectric material, an n-type doped region, the floating fin, an ion-implanted trap-rich region which neutralizes the conduction, or a plasma-treated region where the p-type dopant has been deactivated. In one embodiment, the MPS diode region includes a portion 806a in the gate region 806 which forms an anode of the MPS diode and a portion 802c in the second semiconductor layer 802 which forms a cathode of the MPS diode. In one embodiment, the portion 802c forming the cathode of the body diode is thinner than the semiconductor layer 802 under the active region.

Figure 8I:
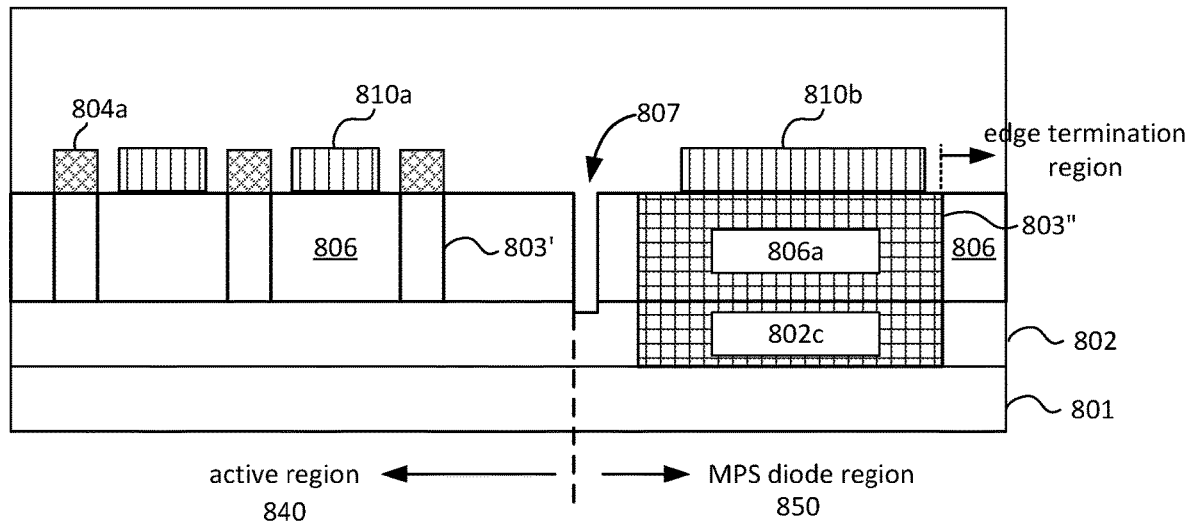

FIG. 8I is a partial cross-sectional view illustrating the device structure after the interlayer dielectric layer 811 is formed on the gate metal layer 810, the third semiconductor layer 806, and the fins 803' including the patterned metal layer 804 (step 728). In one embodiment, interlayer dielectric layer 811 may be formed by deposition using a plasma enhanced chemical vapor deposition (PECVD) process at a temperature of 300 degrees Celsius.

Figure 8J:
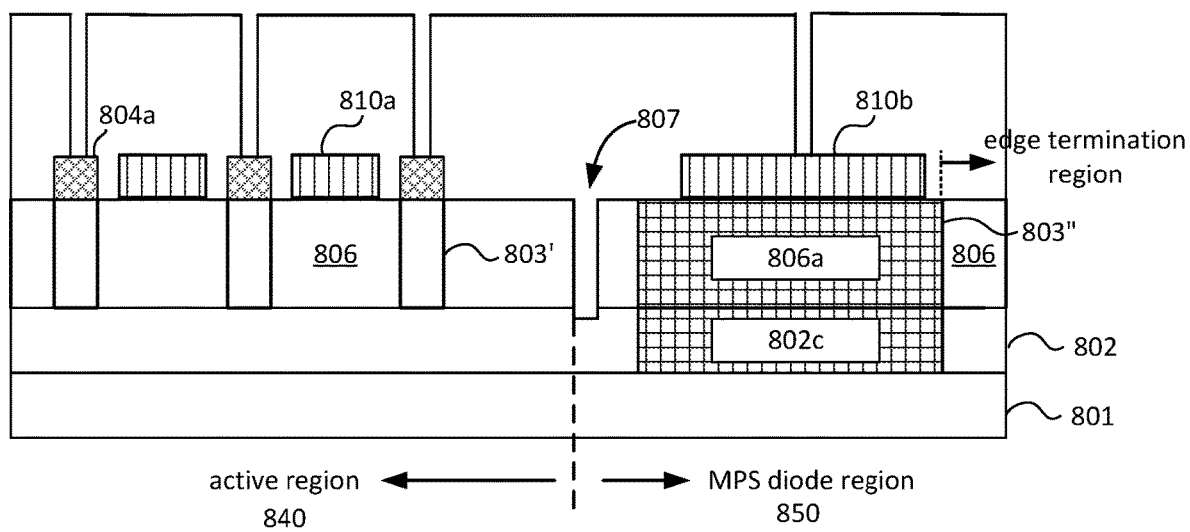

FIG. 8J is a partial cross-sectional view illustrating the device structure after through holes (via holes) 812 are formed in the interlayer dielectric layer. For example, a patterned photoresist is formed over the interlayer dielectric layer with photolithography processes to define locations where via holes (through holes) over the metal layer on the upper portion of the fins and on the second portion 810b of the gate metal layer in the MPS diode region are to be formed. After forming the via holes, the patterned photoresist is removed.

Figure 8K:
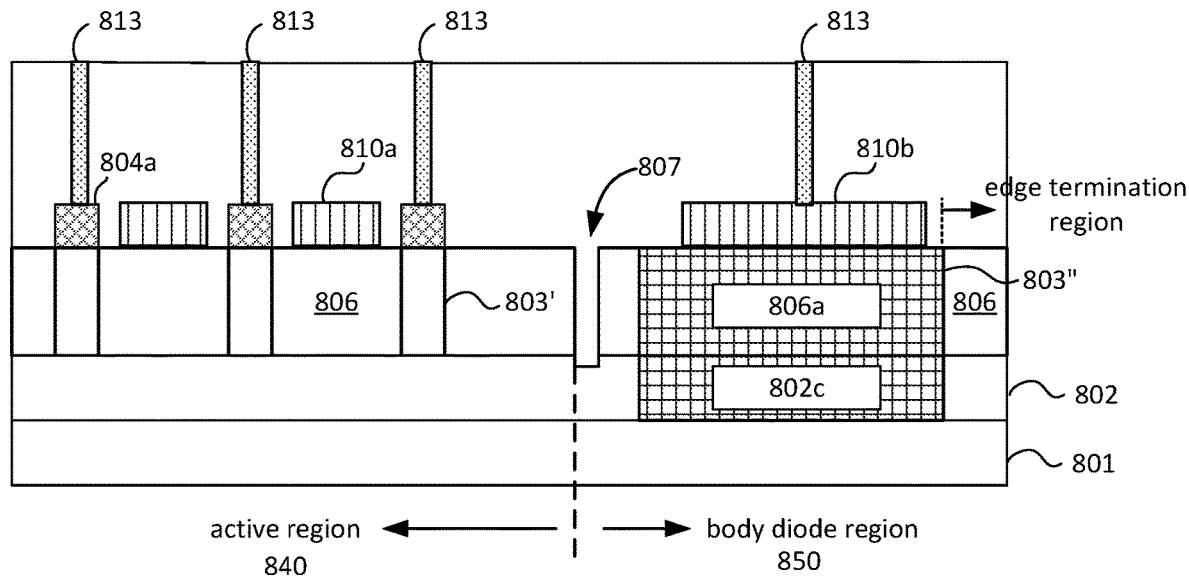

FIG. 8K is a partial cross-sectional view illustrating the device structure after the via holes (through holes) are filled with the conductive material 813.

Figure 8L:
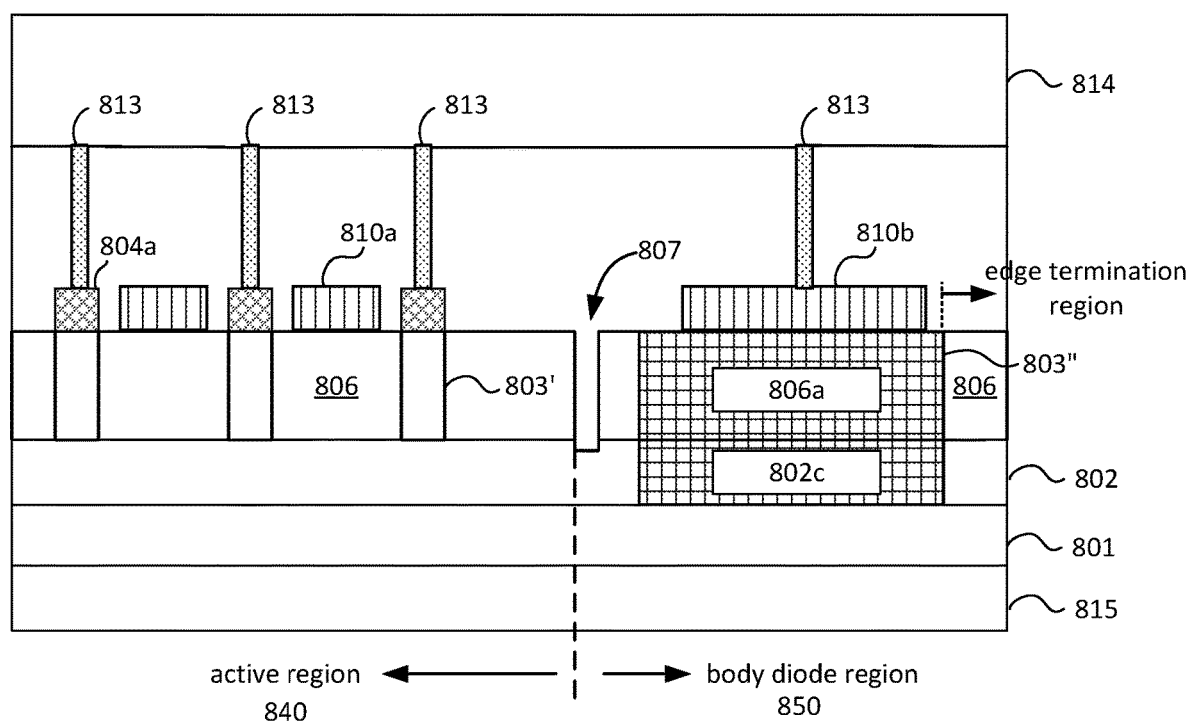

FIG. 8L is a partial cross-sectional view illustrating the device structure after the source pad metal layer 814 is formed in electrical contact with the conductive material 813. Also shown in FIG. 8L, a drain metal layer 815 is formed on the bottom surface of the n+ doped semiconductor substrate 801. The anode 806a of the MPS diode is connected to the source pad metal layer 814, and the cathode 802c of the MPS diode is connected to the drain metal layer 815. Therefore, the anode is thus connected to the source of the vertical FinFET device, and the cathode is connected to the drain of the vertical FinFET device. The source pad metal layer may be formed using any of a variety of processes such as sputtering, evaporation, deposition, etc. The drain metal layer may be formed using any of a variety of processes such as sputtering, evaporation, deposition, etc. A gate pad metal layer (not shown) may be formed in contact with conductive material 813 that fills through-holes 812 connected to the gate metal in the active region.

It is to be understood that the appended claims are not limited to the precise configuration illustrated in the drawings. One of ordinary skill in the art would recognize various modifications, alternatives, and variations may be made in the arrangement and steps of the methods and devices described above without departing from the scope of the invention.

What is claimed is:

1. A vertical junction field effect transistor (JFET), comprising:
   a substrate;
   an active region comprising a plurality of semiconductor fins;
   a source metal layer electrically coupled to a surface of the semiconductor fins;
   a source metal pad layer coupled to the semiconductor fins through the source metal layer;
   a gate region surrounding the semiconductor fins; and
   a body diode surrounding the gate region.

2. The vertical JFET of claim 1, further comprising an isolation region disposed between the active region and the body diode.

3. The vertical JFET of claim 2, wherein the isolation region comprises a trench.

4. The vertical JFET of claim 2, wherein the isolation region comprises a floating fin not electrically coupled to the source pad metal layer.

5. The vertical JFET of claim 2, wherein the isolation region comprises an n-type doped region.

6. The vertical JFET of claim 1, wherein the body diode comprises an anode coupled to the source metal layer and a cathode coupled to a drain of the JFET.

7. The vertical JFET of claim 1, further comprising a drift region coupled to the substrate, wherein the plurality of semiconductor fins are coupled to the drift region.

8. The vertical JFET of claim 7, wherein
   the substrate comprises an n+ GaN layer;
   the drift region comprise an n− GaN layer;
   the semiconductor fins comprise an n GaN layer;
   the body diode comprises an anode on the drift region and a cathode formed by the drift region, wherein the anode comprises a p GaN layer and is coupled to the source metal layer, and wherein the cathode is coupled to a drain of the JFET; and
   the vertical JFET further comprising an edge termination region comprising the p GaN layer and surrounding the body diode.

9. The vertical JFET of claim 1, wherein the body diode is one of a PN junction diode, a Schottky diode, or a merged P-i-N Schottky (MPS) diode.

10. The vertical JFET of claim 1, further comprising an edge termination region surrounding the body diode.

11. A semiconductor device, comprising:
    a substrate comprising an n+ GaN layer;
    a drift layer coupled to the substrate and comprising an n− GaN layer;
    a plurality of fins comprising an n GaN material and coupled to the drift layer;
    a gate layer comprising a p GaN material and surrounding the plurality of fins;
    an integrated body diode surrounding the plurality of fins; and
    an isolation region disposed between the plurality of fins and the integrated body diode.

12. The semiconductor device of claim 11, wherein the integrated body diode is one of a PN diode, a Schottky diode, or a merged PIN Schottky diode.

13. The semiconductor device of claim 11, wherein the isolation region comprises one of a trench, a floating fin, or an n-type doped region.

14. The semiconductor device of claim 11, further comprising a metal layer electrically coupled to the plurality of fins.

15. The semiconductor device of claim 14, wherein the integrated body diode comprises an anode coupled to the metal layer.

16. The semiconductor device of claim 11, wherein the semiconductor device further includes an edge termination region surrounding the integrated body diode.

* * * * *